(12) United States Patent
Forbes

(10) Patent No.: US 6,842,370 B2
(45) Date of Patent: Jan. 11, 2005

(54) VERTICAL NROM HAVING A STORAGE DENSITY OF 1 BIT PER 1F$^2$

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/838,276

(22) Filed: May 4, 2004

(65) Prior Publication Data

US 2004/0202032 A1 Oct. 14, 2004

Related U.S. Application Data

(63) Continuation of application No. 10/177,208, filed on Jun. 21, 2002.

(51) Int. Cl.$^7$ .............................................. G11C 11/34
(52) U.S. Cl. ............. 365/177; 365/185.28; 365/185.03; 257/390; 438/259
(58) Field of Search ................................ 365/158, 171, 365/173, 177, 51, 63, 185.03, 185.18, 185.28; 257/314, 315, 316, 390; 438/259

(56) References Cited

U.S. PATENT DOCUMENTS

| | | |
|---|---|---|
| 4,184,207 A | 1/1980 | McElroy |
| 4,420,504 A | 12/1983 | Cooper |
| 4,755,864 A | 7/1988 | Ariizumi |
| 4,881,114 A | 11/1989 | Mohsen |
| 5,241,496 A | 8/1993 | Lowrey |
| 5,330,930 A | 7/1994 | Chi |
| 5,378,647 A | 1/1995 | Hong |
| 5,379,253 A | 1/1995 | Bergemont |
| 5,386,132 A | 1/1995 | Wong |
| 5,397,725 A | 3/1995 | Wolstenholme |
| 5,467,305 A | 11/1995 | Bertin |
| 5,576,236 A | 11/1996 | Chang |
| 5,739,567 A | 4/1998 | Wong |
| 5,768,192 A | 6/1998 | Eitan |
| 5,792,697 A | 8/1998 | Wen |
| 5,828,602 A | 10/1998 | Wong |

(List continued on next page.)

FOREIGN PATENT DOCUMENTS

| | | |
|---|---|---|
| EP | 84303740.9 | 1/1985 |
| EP | 90115805.5 | 2/1991 |
| EP | 1120836 A1 | 8/2001 |
| EP | 01113179.4 | 12/2002 |
| WO | WO 98/06139 | 2/1998 |

OTHER PUBLICATIONS

B. Eitan et al., "Characterization of Channel Hot Electron Injection by the Subthreshold Slope of NROM™ Device" IEEE Electron Device Lett., vol. 22, No. 11, (Nov. 2001) pp. 556–558, Copyright 2001 IEEE.

(List continued on next page.)

Primary Examiner—Gene N. Auduong
(74) Attorney, Agent, or Firm—Leffert Jay & Polglaze, P.A.

(57) ABSTRACT

Structures and methods for vertical memory cell. The vertical memory cell includes a vertical metal oxide semiconductor field effect transistor (MOSFET) extending outwardly from a substrate. The MOSFET has a first source/drain region, a second source/drain region, a channel region between the first and the second source/drain regions, and a gate separated from the channel region by a gate insulator. A first transmission line is coupled to the first source/drain region. A second transmission line is coupled to the second source/drain region. The MOSFET is adapted to be programmed to have a charge trapped in at least one of a first storage region and a second storage region in the gate insulator and operated with either the first source/drain region or the second source/drain region serving as the source region.

61 Claims, 8 Drawing Sheets

U.S. PATENT DOCUMENTS

| | | |
|---|---|---|
| 5,858,841 A | 1/1999 | Hsu |
| 5,911,106 A | 6/1999 | Tasaka |
| 5,946,558 A | 8/1999 | Hsu |
| 5,966,603 A | 10/1999 | Eitan |
| 5,994,745 A | 11/1999 | Hong |
| 6,011,725 A | 1/2000 | Eitan |
| 6,028,342 A | 2/2000 | Chang |
| 6,030,871 A | 2/2000 | Eitan |
| 6,044,022 A | 3/2000 | Nachumovsky |
| 6,081,456 A | 6/2000 | Dadashev |
| 6,108,240 A | 8/2000 | Lavi |
| 6,133,102 A | 10/2000 | Wu |
| 6,134,156 A | 10/2000 | Eitan |
| 6,143,636 A | 11/2000 | Forbes |
| 6,147,904 A | 11/2000 | Liron |
| 6,157,061 A | 12/2000 | Kawata |
| 6,157,570 A | 12/2000 | Nachumovsky |
| 6,172,396 B1 | 1/2001 | Chang |
| 6,174,758 B1 | 1/2001 | Nachumovsky |
| 6,175,523 B1 | 1/2001 | Yang |
| 6,181,597 B1 | 1/2001 | Nachumovsky |
| 6,184,089 B1 | 2/2001 | Chang |
| 6,201,282 B1 | 3/2001 | Eitan |
| 6,201,737 B1 | 3/2001 | Hollmer |
| 6,204,529 B1 | 3/2001 | Lung |
| 6,207,504 B1 | 3/2001 | Hsieh |
| 6,208,557 B1 | 3/2001 | Bergemont |
| 6,215,702 B1 | 4/2001 | Derhacobian |
| 6,218,695 B1 | 4/2001 | Nachumovsky |
| 6,222,768 B1 | 4/2001 | Hollmer |
| 6,240,020 B1 | 5/2001 | Yang |
| 6,243,300 B1 | 6/2001 | Sunkavalli |
| 6,251,731 B1 | 6/2001 | Wu |
| 6,255,166 B1 | 7/2001 | Ogura |
| 6,256,231 B1 | 7/2001 | Lavi |
| 6,266,281 B1 | 7/2001 | Derhacobian |
| 6,269,023 B1 | 7/2001 | Derhacobian |
| 6,272,043 B1 | 8/2001 | Hollmer |
| 6,275,414 B1 | 8/2001 | Randolph |
| 6,282,118 B1 | 8/2001 | Lung |
| 6,291,854 B1 | 9/2001 | Peng |
| 6,297,096 B1 | 10/2001 | Boaz |
| 6,303,436 B1 | 10/2001 | Sung |
| 6,327,174 B1 | 12/2001 | Jung |
| 6,330,184 B1 | 12/2001 | White |
| 6,348,711 B1 | 2/2002 | Eitan |
| 6,392,930 B2 | 5/2002 | Jung |
| 6,417,053 B1 | 7/2002 | Kuo |
| 6,421,275 B1 | 7/2002 | Chen |
| 6,429,063 B1 | 8/2002 | Eitan |
| 6,432,778 B1 | 8/2002 | Lai |
| 6,461,949 B1 | 10/2002 | Chang |
| 6,468,864 B1 | 10/2002 | Sung |
| 6,469,342 B1 | 10/2002 | Kuo |
| 6,477,084 B1 | 11/2002 | Eitan |
| 6,486,028 B1 | 11/2002 | Chang |
| 6,487,050 B1 | 11/2002 | Liu |
| 6,498,377 B1 | 12/2002 | Lin |
| 6,514,831 B1 | 2/2003 | Liu |
| 6,531,887 B2 | 3/2003 | Sun |
| 6,545,309 B1 | 4/2003 | Kuo |
| 6,552,387 B1 | 4/2003 | Eitan |
| 6,559,013 B1 | 5/2003 | Pan |
| 6,576,511 B2 | 6/2003 | Pan |
| 6,580,135 B2 | 6/2003 | Chen |
| 6,580,630 B1 | 6/2003 | Liu |
| 6,583,479 B1 | 6/2003 | Fastow |
| 6,589,714 B2 * | 7/2003 | Maimon et al. ............ 430/313 |
| 6,602,805 B2 | 8/2003 | Chang |
| 6,607,957 B1 | 8/2003 | Fan |
| 6,610,586 B1 | 8/2003 | Liu |
| 6,613,632 B2 | 9/2003 | Liu |
| 6,617,192 B1 * | 9/2003 | Lowrey et al. ............... 438/95 |
| 6,617,204 B2 | 9/2003 | Sung |
| 6,764,897 B2 * | 7/2004 | Lowrey et al. ............ 438/238 |
| 2001/0001075 A1 | 5/2001 | Ngo |
| 2001/0004332 A1 | 6/2001 | Eitan |
| 2001/0011755 A1 | 8/2001 | Tasaka |
| 2002/0027264 A1 | 3/2002 | Forbes |
| 2002/0028541 A1 | 3/2002 | Lee |
| 2002/0142569 A1 | 10/2002 | Chang |
| 2002/0146885 A1 | 10/2002 | Chen |
| 2002/0151138 A1 | 10/2002 | Liu |
| 2002/0177275 A1 | 11/2002 | Liu |
| 2002/0182829 A1 | 12/2002 | Chen |
| 2003/0057997 A1 | 3/2003 | Sun |
| 2003/0067807 A1 | 4/2003 | Lin |
| 2003/0117861 A1 | 6/2003 | Maayan |

OTHER PUBLICATIONS

B. Eitan et al., "Spatial Characterization of Hot Carriers Injected into the Gate Dielectric Stack of a MOFSET Based on Non–Volatile Memory Device," date unknown, pp. 58–60.

B. Eitan et al., "NROM: A Novel Localized Trapping, 2–Bit Nonvolatile Memory Cell," IEEE Electron Device Lett, vol. 21, No. 11, (Nov. 2000), pp. 543–545, Copyright 2000 IEEE.

E. Maayan et al., "A 512Mb NROM Flash Data Storage Memory with 8MB/s Data Range," Dig. IEEE Int. Solid-State Circuits Conf., San Francisco, (Feb. 2002), pp. 1–8, Copyright Saifun Semiconductors Ltd. 2000.

E. Maayan et al., "A 512Mb NROM Flash Data Storage Memory with 8MB/s Data Range," ISSCC 2002 Visuals Supplement, Session 6, SRAM and Non–Volatile Memories, 6.1 and 6.2, pp. 76–77, 407–408. Copyright 1990 IEEE.

M. Janai, "Data Retention, Endurance and Acceleration Factors of NROM Devices," IEEE $41^{st}$ Annual International Reliability Physics Symposium, Dallas, TX (2003), pp. 502–505, Copyright 1989 IEEE.

S. Minami and Y. Kamigaki, "A Novel MONOS Nonvolatile Memory Device Ensuring 10–Year Data Retention after $10^7$ Erase/Write Cycles," IEEE Transactions on Electron Devices, vol. 40, No. 11 (Nov. 1993) pp. 2011–2017, Copyright 1998 IEEE.

C. Pan, K. Wu, P. Freiberger, A. Chatterjee, G. Sery, "A Scaling Methodology for Oxide–Nitride–Oxide Interpoly Dielectric for EPROM Applications," IEEE Transactions on Electron Devices, vol. 37, No. 6, (Jun. 1990), pp. 1439–1443, Copyright 1990 IEEE.

P. Manos and C.,Hart, "A Self–Aligned EPROM Structure with Superior Data Retention," IEEE Electron Device Letters, vol. 11, No. 7, (Jul. 1990) pp. 309–311, Copyright 1990 IEEE.

W. Owen and W. Tchon, "$E^2$PROM Product Issues and Technology Trends," IEEE 1989, pp. 17–19, Copyright 1989 IEEE.

T. Huang, F. Jong, T. Chao, H. Lin, L. Leu, K. Young, C. Lin, K. Chiu, "Improving Radiation Hardness of EEPROM/Flash Cell B Y $N_2O$ Annealing," IEEE Electron Device Letters, vol. 19, No. 7 (Jul. 1998), pp. 256–258, Copyright 1998 IEEE.

B. Eitan et al., "Electrons Retention Model for Localized Charge in Oxide–Nitride–Oxide (ONO) Dieletric," IEEE Device Lett., vol. 23, No. 9, (Sep. 2002), pp. 556–558. Copyright 2002 IEEE.

T. Nozaki, T. Tanaka, Y. Kijiya, E. Kinoshita, T. Tsuchiya, Y. Hayashi, "A 1–Mb EEPROM with MONOS Memory Cell for Semiconductor Disk Application," IEEE Journal of Solid–State Circuits, vol. 26, No. 4 (Apr. 1991), pp. 497–501, Copyright 1991 IEEE.

F. Vollebregt, R. Cuppens, F. Druyts, G. Lemmen, F. Verberne, J. Solo, "A New E(E)PROM Technology With A TiSi$_2$ Control Gate," IEEE 1989, pp. 25.8.1–25.8.4, Copyright 1989 IEEE.

B. Eitan et al., "Impact of Programming Charge Distribution on Threshold Voltage and Subthreshold Slope of NROM Memory cells," IEEE Transactions on Electron Devices, vol. 49, No. 11, (Nov. 2002), pp. 1939–1946, Copyright 2002 IEEE.

B. Eitan et al., "Spatial characterization of Channel hot electron injection utilizing subthreshold slope of the localized charge storage NROM™ memory device," Non–Volatile Semiconductor Memory Workshop (NVSMW), Monterey, CA, (Aug. 2001), pp. 1–2.

B. Eitan et al., "Can NROM, a 2–bit, Trapping Storage NVM Cell, Give a Real Challenge to Floating Gate Cells?" Int. Conf. on Solid State Devices and Materials, Tokyo, (1999), pp. 1–3, Copyright 1999 Saifun Semiconductors Ltd.

S. Ogura, et al. "Twin MONOS Cell with Dual Control Gates," Halo LSI and New Halo, pp 187–187.3, Date Unknown.

T. Sugizaki, et al. "New 2–bit/Tr MONOS Type Flash Memory using Al$_2$O$_3$ as Charge Trapping Layer," Fujitsu Laboratories Ltd, Date Unknown.

T. Saito, et al. "Hot Hole Erase Characteristics and Reliability in Twin MONOS Device" Halo LSI, Date Unknown.

Saifun Semiconductors, LTD. PowerPoint Presentation, Date Unknown.

Y. Roizin, et al. "Novel Techniques for data retention and Leff measurements in two bit MicroFlash® Memory Cells," Characterization and Metrology for ULSI Technology: 200 International Conf., pp. 181–185, Copyright 2001 American Institute of Physics, 1–56396–967–X/01.

W. J. Tsai, et al. "Cause of Data Retention Loss in a Nitride–Based Localized Trapping Storage Flash Memory Cell," IEEE 40$^{th}$ Annual International Reliability Physics Symposium, Dallas, (2002), pp. 34–38. Copyright 2002 IEEE.

W.J. Tsai, et al. "Data Retention Behavior of a SONOS Type Two–Bit Storage Flash Memory Cell," IEDM 01–0179–722, Copyright 2001 IEEE.

A. Shappir, et al., "Subtreshold slope degradation model for localized–charge–trapping based non–volatile memory devices," Solid–State Electronics 47 (2003), pp. 937–941. Copyright 2003 Elsevier Science Ltd.

R. Neale, "AMD's MirrorBit—a big step in Flash progress," Electronic Engineering Design, V. 74, No. 906, pp. 47–50.

I. Bloom, et al., "NROM™—a new technology for non-volatile memory products" Solid–State Electronics 46 (2002), pp. 1757–1763. Copyright 2002 Elsevier Science Ltd.

J. Bu and M. White, "Electrical characterization on ONO triple dieletrics in SONOS nonvolatile memory devices," Solid–State Electronics 45 (2001) pp. 47–51. Copyright 2001 Elsevier Science Ltd.

Y. Kamigaki and S. Minami, "MNOS Nonvolatile Semiconductor Memory Technology: Present and Future," IEICE Trans. Electron, vol. E84–C, No. 6, pp. 713–723 (Jun. 2001).

E. Lusky, et al., "Electron Discharge Model of Locally–Trapped Charge in Oxide–Nitride–Oxide (ONO) Gates for NROM™ Non–Volatile Semiconductor Memory Devices," Extended Abstracts of the 2001 International Conference on Solid State Devices and Materials, Tokyo, 2001 pp. 534–535.

A. Nughin, "n–Channel 256kb and 1Mb EEPROMs," ISSCC91, Session 134, Special Session on Technology in the USSR, Paper 13.4, 1991 IEEE InternationalSolid State Circuits Conference, Digest of Technical Papers, pp. 228–229, 319, Date Unknown.

G. Xue, et al., "Low Voltage Low Cost Nitride Embedded Flash Memory Cell" IMEC., Date Unknown.

L. Breuil, et al., "A new 2 isolated–bits/cell flash memory device with self aligned split gate structure using ONO stacks for charge storage," IMEC, Date Unknown.

J. Willer, et al., "UMEM: A U–shape Non–Volatile–Memory Cell," Igentix GmbH &Co. KG., Infineon Technologies and Saifun Semiconductors, Date Unknown.

S. Kang, et al., "A Study of SONOS Nonvolatile Memory Cell Controlled Structurally by Localizing Charge–Trapping Layer," Samsung Electrons Co., Ltd., Date Unknown.

Y. Roizin, et al., "In–Process Charging in microFLASH® Memory Cells," Tower Semiconductor, Ltd., Date Unknown.

A. Shappir, et al., "Subthreshold slope degradation model for localized–charge–trapping based non–volatile memory devices," Solid State Electronics, 47 (2003) pp. 937–941, Copyright 2003 Elsevier Science Ltd.

I. Fujiwara, et al., "High speed program/erase sub 100 nm MONOS memory cell," Sony Corporation, Date Unknown.

E. Lusky, et al., "Investigation of Spatial Distribution of CHE Injection Utilizing the Subthreshold Slope and the Gate Induced Drain Leakage (GIDL) Characteristics of the NROM™ Device," Saifun Semiconductors, Ltd. and Tel Aviv University, Dept of Physical Electronics, pp. 1–2., Date Unknown.

C. C. Yeh, et al., "A Modified Read Scheme to Improve Read Disturb and Second Bit Effect in a Scaled MXVAND Flash Memory Cell," Macronix International Co., Ltd. and Department of Electronics Engineering, National Chiao–Tung University, Date Unknown.

Y. K. Lee, et al., "30–nm Twin Silicon–Oxide–Nitride–Oxide–Silicon (SONOS) Memory (TSM) with High Erase Speed and Reliability," School of Electrical Engineering, Seoul National University, C&M, System LSI, ATD, PD, Samsung Electronics Co., Date Unknown.

J. H. Kim, et al., "Highly Manufacturable SONOS Non–Volatile Memory for the Embedded SoC Solution," 2003 Symposium on VLSI Technology Digest of Technical Papers, pp. 31–32.

Y. Hayashi, et al., "Twin MONOS Cell with Dual Control Gates," 2000 Symposium on VLSI Technology Digest of Technical Papers, 2000 IEEE, pp. 122–123.

M. K. Cho and D. M. Kim, "High Performance SONOS Memory Cells Free of Drain Turn–On and Over–Erase: Compatibility Issue with Current Flash Technology," IEEE Electron Device Letters, vol. 21, No. 8, Aug. 2000, pp. 399–401, Copyright 2000 IEEE.

T. Y. Chan, K.K. Young and C. Hu, "A True Single–Transistor Oxide–Nitride–Oxide EEPROM Device," IEEE Electron Device Letters, vol. EDL–8, No. 3, Mar. 1987, pp. 93–95, Copyright 1987 IEEE.

I. Bloom, et al., "NROM™ NVM technology for MultiMedia Applications," Saifun Semiconductors, Ltd. Ingentix, Ltd. and Infineon Technologies, Date Unknown.

E. J. Prinz, et al., "An Embedded 90nm SONOS Flash EEPROM Utilizing Hot Electron Injection Programming and 2–Sided Hot Hole Injection Erase," Motorola Embedded Memory Center, Date Unknown.

Y. Roizin, et al., "Retention Characteristics of microFLASH® Memory (Activation Energy of Traps in the ONO Stack)," Tower Semiconductor, Ltd., Date Unknown.

Y. Roizin, et al., "Activation Energy of Traps in the ONO Stack of microFLASH® Memory Cells," Tower Semiconductor, Ltd., Date Unknown.

Y. Roizin, et al., "'Dummy' Gox for Optimization of microFLASH® Technology," Tower Semiconductor, Ltd., Date Unknown.

Y. K. Lee, et al., "Multi–Level Verticle Channel SONOS Nonvolatile Memory on SOI," 2002 Symposium on VLSI Technology Digest of Technical Papers, Copyright 2002 IEEE.

T. Saito, et al., "CHE Program Behavior in MONOS Device," Halo LSI, Date Unknown.

J. Bu, et al., "Retention Reliability Enhanced SONOS NVSM with Scaled Programming Voltage," Microelectronics Lab., Date Unknown.

H. Tomiye, et al., "A novel 2–bit/cell MONOS memory device with a wrapped–conrol–gate structure that applies source–side hot–electron injection," 2002 Symposium on VLSI Technology Digest of Technical Papers, Copyright 2002 IEEE.

Certified Translation, "Flash cell that seeks to replace current technology introduced enabling both low cost and high performance" Nikkei Microdevices, Nov. 1999, pp. 147–148.

K. Lee, et al., "Multilevel Vertical Channel SONOS Nonvolatile Memory on SOI," 2002 Symposium On VLSI Technology Digest of Technical Papers, Jun. 11, 2002, pp. 208–209, Copyright 2002 IEEE.

* cited by examiner-

VERTICAL NROM HAVING A STORAGE DENSITY OF 1 BIT PER 1F²

CROSS REFERENCE TO RELATED APPLICATIONS

This Application is a Continuation of U.S. application Ser. No. 10/177,208 filed Jun. 21, 2002, which is related to the following co-pending, commonly assigned U.S. patent applications: "Write Once Read Only Memory Employing Charge Trapping in Insulators," U.S. Ser. No. 10/177,077, "Write Once Read Only Memory Employing Floating Gates," U.S. Ser. No. 10/177,083, "Nanocrystal Write Once Read Only Memory for Archival Storage," U.S. Ser. No. 10/177,214, "Write Once Read Only Memory with Large Work Function Floating Gates," U.S. Ser. No. 10/177,213, "Ferroelectric Write Once Read Only Memory for Archival Storage," U.S. Ser. No. 10/177,082, and "Multistate NROM Having a Storage Density Much Greater than 1 Bit per $1F^2$," U.S. Ser. No. 10/177,211, each of which disclosure is herein incorporated by reference.

FIELD OF THE INVENTION

The present invention relates generally to semiconductor integrated circuits and, more particularly, to vertical NROM having a storage density of one bit for each 1.0 lithographic feature squared ($1F^2$) unit area.

BACKGROUND OF THE INVENTION

Many electronic products need various amounts of memory to store information, e.g. data One common type of high speed, low cost memory includes dynamic random access memory (DRAM) comprised of individual DRAM cells arranged in arrays. DRAM cells include an access transistor, e.g a metal oxide semiconducting field effect transistor (MOSFET), coupled to a capacitor cell. With successive generations of DRAM chips, an emphasis continues to be placed on increasing array density and maximizing chip real estate while minimizing the cost of manufacture. It is further desirable to increase array density with little or no modification of the DRAM optimized process flow.

A requirement exists for memory devices which need only be programmed a limited number of times, as for instance to function as an electronic film in a camera. If the memory arrays have a very high density then they can store a large number of very high resolution images in a digital camera. If the memory is inexpensive then it can for instance replace the light sensitive films which are used to store images in conventional cameras.

Thus, there is a need for improved DRAM technology compatible high density memory cells. It is desirable that such memory cells be fabricated on a DRAM chip with little or no modification of the DRAM process flow. It is further desirable that such memory cells operate with lower programming voltages than that used by conventional DRAM cells, yet still hold sufficient charge to withstand the effects of parasitic capacitances and noise due to circuit operation.

SUMMARY OF THE INVENTION

The above mentioned problems for creating DRAM technology high density memory cells as well as other problems are addressed by the present invention and will be understood by reading and studying the following specification. This disclosure teaches structures and methods using MOSFET devices as a multiple bit memory cells in a DRAM integrated circuit. The structures and methods use the existing process sequence for MOSFET's in DRAM technology.

In particular, an illustrative embodiment of the present invention includes a vertical multiple bit memory cell. The vertical multiple bit memory cell includes a vertical metal oxide semiconductor field effect transistor (MOSFET) extending outwardly from a substrate. The MOSFET has a first source/drain region, a second source/drain region, a channel region between the first and the second source/drain regions, and a gate separated from the channel region by a gate insulator. A first transmission line is coupled to the first source/drain region. A second transmission line is coupled to the second source/drain region. The MOSFET is adapted to be programmed to have a charge trapped in at least one of a first storage region and a second storage region in the gate insulator and operated with either the first source/drain region or the second source/drain region serving as the source region.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
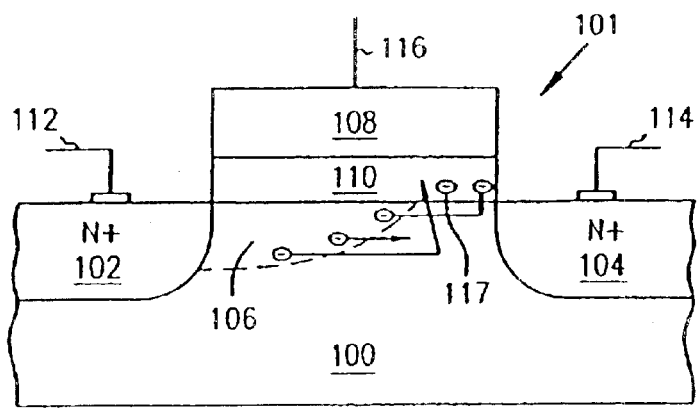
FIG. 1A is a block diagram of a metal oxide semiconductor field effect transistor (MOSFET) in a substrate according to the teachings of the prior art.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is useful in illustrating the conventional operation of a MOSFET such as can be used in a DRAM array. FIG. 1A illustrates the normal hot electron injection and degradation of devices operated in the forward direction. As is explained below, since the electrons are trapped near the drain they are not very effective in changing the device characteristics.

FIG. 1A is a block diagram of a metal oxide semiconductor field effect transistor (MOSFET) 101 in a substrate 100. The MOSFET 101 includes a source region 102, a drain region 104, a channel region 106 in the substrate 100 between the source region 102 and the drain region 104. A gate 108 is separated from the channel region 108 by a gate oxide 110. A sourceline 112 is coupled to the source region 102. A bit line 114 is coupled to the drain region 104. A wordline 116 is coupled to the gate 108.

In conventional operation, a drain to source voltage potential (Vds) is set up between the drain region 104 and the source region 102. A voltage potential is then applied to the gate 108 via a wordline 116. Once the voltage potential applied to the gate 108 surpasses the characteristic voltage threshold (Vt) of the MOSFET a channel 106 forms in the substrate 100 between the drain region 104 and the source region 102. Formation of the channel 106 permits conduction between the drain region 104 and the source region 102, and a current signal (Ids) can be detected at the drain region 104.

Figure 1B:
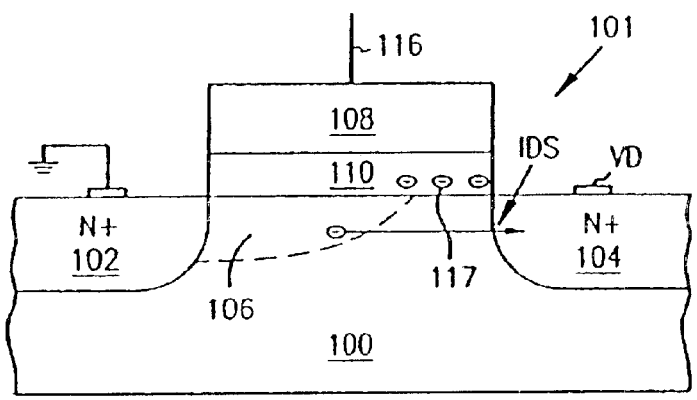
FIG. 1B illustrates the MOSFET of FIG. 1A operated in the forward direction showing some degree of device degradation due to electrons being trapped in the gate oxide near the drain region over gradual use.

In operation of the conventional MOSFET of FIG. 1A, some degree of device degradation does gradually occur for MOSFETs operated in the forward direction by electrons 117 becoming trapped in the gate oxide 110 near the drain region 104. This effect is illustrated in FIG. 1B. However, since the electrons 117 are trapped near the drain region 104 they are not very effective in changing the MOSFET characteristics.

Figure 1C:
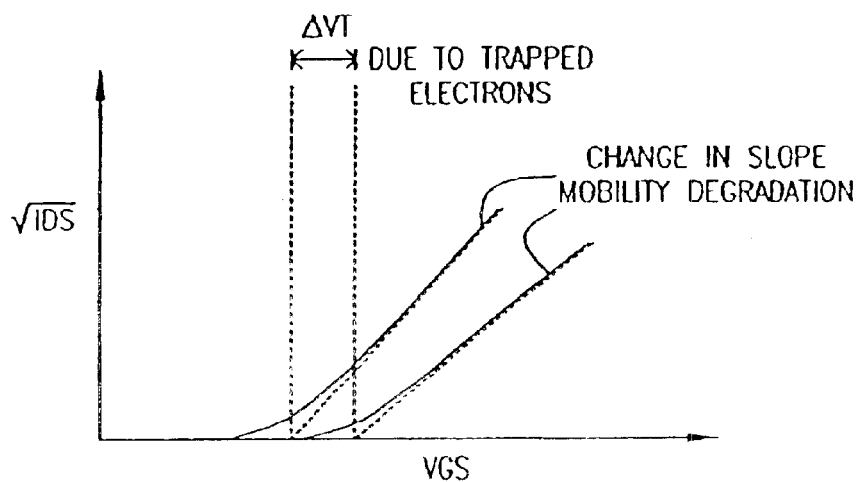
FIG. 1C is a graph showing the square root of the current signal (Ids) taken at the drain region of the conventional MOSFET versus the voltage potential (VGS) established between the gate and the source region.

FIG. 1C illustrates this point. FIG. 1C is a graph showing the square root of the current signal (Ids) taken at the drain region versus the voltage potential (VGS) established between the gate 108 and the source region 102. The change in the slope of the plot of $\sqrt{Ids}$ versus VGS represents the change in the charge carrier mobility in the channel 106.

In FIG. 1C, ΔVT represents the minimal change in the MOSFET's threshold voltage resulting from electrons gradually being trapped in the gate oxide 110 near the drain region 104, under normal operation, due to device degradation. This results in a fixed trapped charge in the gate oxide 110 near the drain region 104. Slope 1 represents the charge carrier mobility in the channel 106 for FIG. 1A having no electrons trapped in the gate oxide 110. Slope 2 represents the charge mobility in the channel 106 for the conventional MOSFET of FIG. 1B having electrons 117 trapped in the gate oxide 110 near the drain region 104. As shown by a comparison of slope 1 and slope 2 in FIG. 1C, the electrons 117 trapped in the gate oxide 110 near the drain region 104 of the conventional MOSFET do not significantly change the charge mobility in the channel 106.

There are two components to the effects of stress and hot electron injection. One component includes a threshold voltage shift due to the trapped electrons and a second component includes mobility degradation due to additional scattering of carrier electrons caused by this trapped charge and additional surface states. When a conventional MOSFET degrades, or is "stressed," over operation in the forward direction, electrons do gradually get injected and become trapped in the gate oxide near the drain. In this portion of the conventional MOSFET there is virtually no channel underneath the gate oxide. Thus the trapped charge modulates the threshold voltage and charge mobility only slightly.

The inventors have previously described programmable memory devices and functions based on the reverse stressing of MOSFET's in a conventional CMOS process and technology in order to form programmable address decode and correction. (See generally, L. Forbes, W. P. Noble and E. H. Cloud, "MOSFET technology for programmable address decode and correction," application Ser. No. 09/383,804). That disclosure, however, did not describe vertical multiple bit cell solutions, but rather address decode and correction issues.

According to the teachings of the present invention, normal MOSFETs can be programmed by operation in the reverse direction and utilizing avalanche hot electron injection to trap electrons in the gate oxide of the MOSFET. When the programmed MOSFET is subsequently operated in the forward direction the electrons trapped in the oxide are near the source and cause the channel to have two different threshold voltage regions. The novel programmed MOSFETs of the present invention conduct significantly less current than conventional MOSFETs, particularly at low drain voltages. These electrons will remain trapped in the gate oxide unless negative gate voltages are applied. The electrons will not be removed from the gate oxide when positive or zero gate voltages are applied. Erasure can be accomplished by applying negative gate voltages and/or increasing the temperature with negative gate bias applied to cause the trapped electrons to be re-emitted back into the silicon channel of the MOSFET. (See generally, L. Forbes, E. Sun, R. Alders and J. Moll, "Field induced re-emission of electrons trapped in $SiO_2$," IEEE Trans. Electron Device, vol. ED-26, no. 11, pp. 1816–1818 (November 1979); S.S.B. Or, N. Hwang, and L. Forbes, "Tunneling and Thermal emission from a distribution of deep traps in $SiO_2$," IEEE Trans. on Electron Devices, vol. 40, no. 6, pp. 1100–1103 (June 1993); S. A. Abbas and R. C. Dockerty, "N-channel IGFET design limitations due to hot electron trapping," IEEE Int. Electron Devices Mtg., Washington D.C., December 1975, pp. 35–38).

Figure 2A:
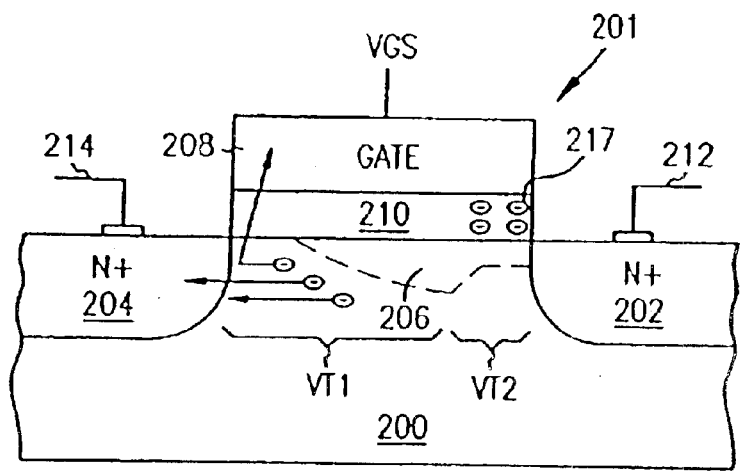
FIG. 2A is a diagram of a programmed MOSFET which can be used as a multiple bit cell according to the teachings of the present invention.
Figure 2B:
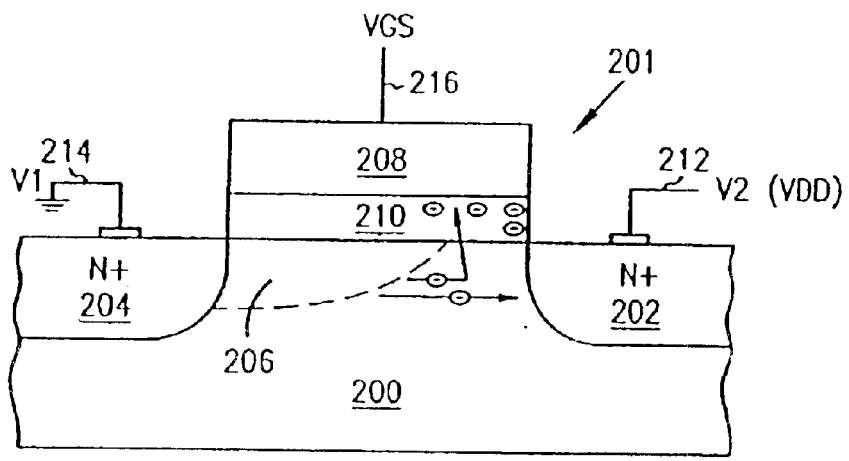
FIG. 2B is a diagram suitable for explaining the method by which the MOSFET of the multiple bit cell of the present invention can be programmed to achieve the embodiments of the present invention.
Figure 2C:
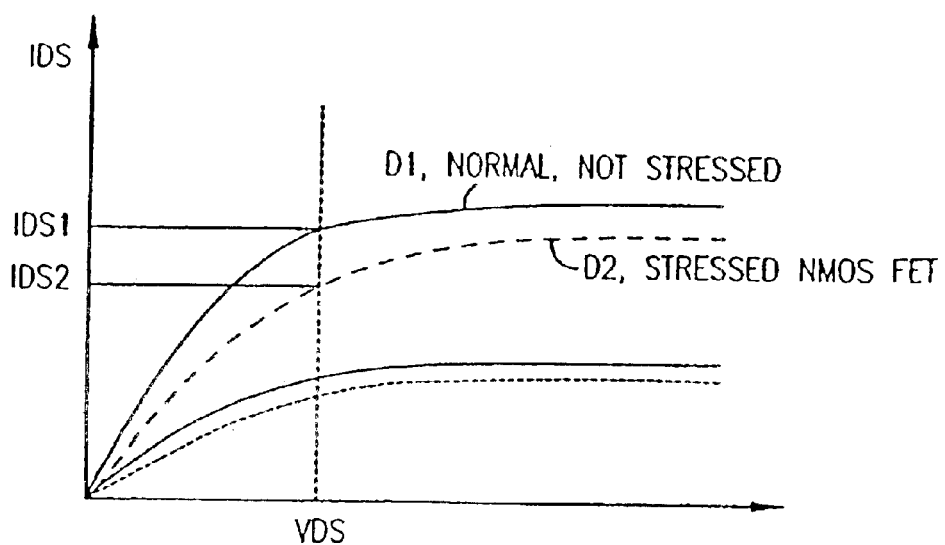
FIG. 2C is a graph plotting the current signal (Ids) detected at the drain region versus a voltage potential, or drain voltage, (VDS) set up between the drain region and the source region (Ids vs. VDS).

FIGS. 2A–2C illustrate are useful in illustrating the present invention in which a much larger change in device characteristics is obtained by programming the device in the reverse direction and subsequently reading the device by operating it in the forward direction.

FIG. 2A is a diagram of a programmed MOSFET which can be used as a multiple bit cell according to the teachings of the present invention. As shown in FIG. 2A the multiple bit cell 201 includes a MOSFET in a substrate 200 which has a first source/drain region 202, a second source/drain region 204, and a channel region 206 between the first and second source/drain regions, 202 and 204. In one embodiment, the first source/drain region 202 includes a source region 202 for the MOSFET and the second source/drain region 204 includes a drain region 204 for the MOSFET. FIG. 2A further illustrates a gate 208 separated from the channel region 206 by a gate oxide 210. A first transmission line 212 is coupled to the first source/drain region 202 and a second transmission line 214 is coupled to the second source/drain region 204. In one embodiment, the first transmission line includes a sourceline 212 and the second transmission line includes a bit line 214.

As stated above, multiple bit cell 201 is comprised of a programmed MOSFET. This programmed MOSFET has a charge 217 trapped in the gate oxide 210 adjacent to the first source/drain region 202 such that the channel region 206 has a first voltage threshold region (Vt1) and a second voltage threshold region (Vt2) in the channel 206. In one embodiment, the charge 217 trapped in the gate oxide 210 adjacent to the first source/drain region 202 includes a trapped electron charge 217. According to the teachings of the present invention and as described in more detail below, the multiple bit cell can be programmed to have a charge stored in at least one of a first storage region and a second storage region in the gate insulator 210 and operated with either the first source/drain region 202 or the second source/drain region 204 serving as the source region such that the multiple bit cell 201 will have a first voltage threshold region (Vt1) and a second voltage threshold region (Vt2) and such that the programmed multiple bit cell operates at reduced drain source current.

FIG. 2A illustrates the Vt2 in the channel 206 is adjacent the first source/drain region 202 and that the Vt1 in the channel 206 is adjacent the second source/drain region 204. However, the invention is not so limited and in one embodiment Vt1 is adjacent the first source/drain region. According to the teachings of the present invention, Vt2 and Vt1 vary depending on in which direction the multiple bit cell is operated. In this manner multiple bits can be stored on the multiple bit cell 201.

FIG. 2B is a diagram suitable for explaining the method by which the MOSFET of the multiple bit cell 201 of the present invention can be programmed to achieve the embodiments of the present invention. As shown in FIG. 2B the method includes programming the MOSFET in a reverse direction. Programming the MOSFET in the reverse direction includes applying a first voltage potential V1 to a drain region 204 of the MOSFET. In one embodiment, applying a first voltage potential V1 to the drain region 204 of the MOSFET includes grounding the drain region 204 of the MOSFET as shown in FIG. 2B. A second voltage potential V2 is applied to a source region 202 of the MOSFET. In one embodiment, applying a second voltage potential V2 to the source region 202 includes applying a high positive voltage potential (VDD) to the source region 202 of the MOSFET, as shown in FIG. 2B. A gate potential VGS is applied to a gate 208 of the MOSFET. In one embodiment, the gate potential VGS includes a voltage potential which is less than the second voltage potential V2, but which is sufficient to establish conduction in the channel 206 of the MOSFET between the drain region 204 and the source region 202. As shown in FIG. 2B, applying the first, second and gate potentials (V1, V2, and VGS respectively) to the MOSFET creates a hot electron injection into a gate oxide 210 of the MOSFET adjacent to the source region 202. In other words, applying the first, second and gate potentials (V1, V2, and VGS respectively) provides enough energy to the charge carriers, e.g. electrons, being conducted across the channel 206 that, once the charge carriers are near the source region 202, a number of the charge carriers get excited into the gate oxide 210 adjacent to the source region 202. Here the charge carriers become trapped.

In one embodiment of the present invention, the method is continued by subsequently operating the MOSFET in the forward direction in its programmed state during a read operation. Accordingly, the read operation includes grounding the source region 202 and precharging the drain region a fractional voltage of VDD. If the device is addressed by a wordline coupled to the gate, then its conductivity will be determined by the presence or absence of stored charge in the gate insulator. That is, a gate potential can be applied to the gate 208 by a wordline 216 in an effort to form a conduction channel between the source and the drain regions as done with addressing and reading conventional DRAM cells.

However, now in its programmed state, the conduction channel 206 of the MOSFET will have a first voltage threshold region (Vt1) adjacent to the drain region 204 and a second voltage threshold region (Vt2) adjacent to the source region 202, as explained and described in detail in connection with FIG. 2A. According to the teachings of the present invention, the Vt2 has a greater voltage threshold than the Vt1 due to the hot electron injection 217 into a gate oxide 210 of the MOSFET adjacent to the source region 202.

FIG. 2C is a graph plotting a current signal (Ids) detected at the second source/drain region 204 versus a voltage potential, or drain voltage, (VDS) set up between the second source/drain region 204 and the first source/drain region 202 (Ids vs. VDS). In one embodiment, VDS represents the voltage potential set up between the drain region 204 and the source region 202. In FIG. 2C, the curve plotted as D1 represents the conduction behavior of a conventional MOSFET which is not programmed according to the teachings of the present invention. The curve D2 represents the conduction behavior of the programmed MOSFET, described above in connection with FIG. 2A, according to the teachings of the present invention. As shown in FIG. 2C, for a particular drain voltage, VDS, the current signal (IDS2) detected at the second source/drain region 204 for the programmed MOSFET (curve D2) is significantly lower than the current signal (IDS1) detected at the second source/drain region 204 for the conventional MOSFET which is not programmed according to the teachings of the present invention. Again, this is attributed to the fact that the channel 206 in the programmed MOSFET of the present invention has two voltage threshold regions and that the voltage threshold, Vt2, near the first source/drain region 202 has a higher voltage threshold than Vt1 near the second source/drain region due to the charge 217 trapped in the gate oxide 217 adjacent to the first source/drain region 202.

Some of these effects have recently been described for use in a different device structure, called an NROM, for flash memories. This latter work in Israel and Germany is based on employing charge trapping in a silicon nitride layer in a non-conventional flash memory device structure. (See generally, B. Eitan et al., "Characterization of Channel Hot Electron Injection by the Subthreshold Slope of NROM device," IEEE Electron Device Lett., Vol. 22, No. 11, pp. 556–558, (November 2001); B. Etian et al., "NROM: A novel localized Trapping, 2-Bit Nonvolatile Memory Cell," IEEE Electron Device Lett., Vol. 21, No. 11, pp. 543–545, (November 2000)). Charge trapping in silicon nitride gate insulators was the basic mechanism used in MNOS memory devices (see generally, S. Sze, Physics of Semiconductor Devices, Wiley, N.Y., 1981, pp. 504–506), charge trapping in aluminum oxide gates was the mechanism used in MIOS memory devices (see generally, S. Sze, Physics of Semiconductor Devices, Wiley, N.Y., 1981, pp. 504–506), and the present inventors have previously disclosed charge trapping at isolated point defects in gate insulators (see generally, L. Forbes and J. Geusic, "Memory using insulator traps," U.S. Pat. No. 6,140,181, issued Oct. 31, 2000).

In contrast to the above work, the present invention disclosures programming a MOSFET in a reverse direction to trap charge in a first or a second storage region in a gate insulator adjacent either a first or a second source/drain region. The MOSFET can be programmed and operated in either direction such that the MOSFET has a storage density of 1bit/1F$^2$. The MOSFET can be operated with either the first or the second source/drain region serving as the source such that a charge trapped in the gate insulator in either the first or the second storage region, adjacent to the first or the second source/drain region serving as the source, will provide a reduced drain source current. The MOSFET having a storage density of 1bit/1F$^2$ is based on a modification of DRAM technology.

Prior art DRAM technology generally employs silicon oxide as the gate insulator. Further the emphasis in conventional DRAM devices is placed on trying to minimize charge trapping in the silicon oxide gate insulator. According to the teachings of the present invention, a variety of insulators are used to trap electrons more efficiently than in silicon oxide. That is, in the present invention, the vertical multiple bit memory cell employs charge trapping in gate insulators such as, wet silicon oxide, silicon nitride, silicon oxynitride SON, silicon rich oxide SRO, aluminum oxide Al$_2$O$_3$, composite layers of these insulators such as oxide and then silicon nitride, or oxide and then aluminum oxide, or multiple layers as oxide-nitride-oxide. While the charge trapping efficiency of silicon oxide may be low such is not the case for silicon nitride or composite layers of silicon oxide and nitride.

Figure 3A:
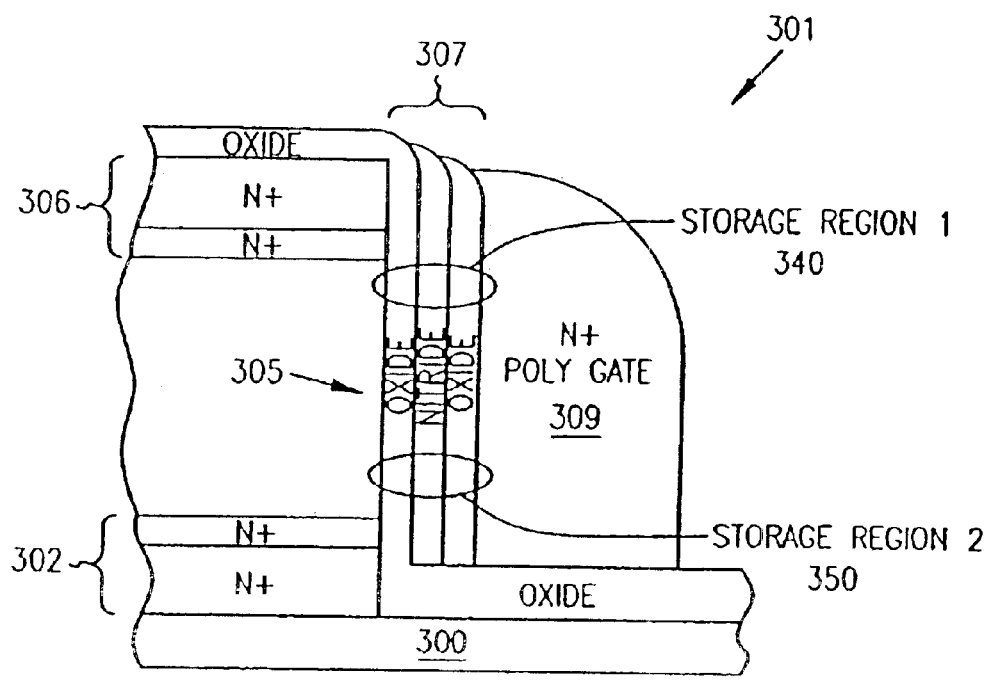
FIG. 3A illustrates a vertical NROM 301 having a storage density of one bit per one photolithographic feature squared ($1F^2$) unit area according to the teachings of the present invention.

FIG. 3A illustrates a vertical NROM 301 having a storage density of one bit per one photolithographic feature squared (1F$^2$) unit area according to the teachings of the present invention. As shown in FIG. 3A, the vertical NROM 301 includes a vertical metal oxide semiconductor field effect transistor (MOSFET) 301 extending outwardly from a substrate 300. The MOSFET 301 has a first source/drain region 302 which in this n-channel embodiment includes a heavily doped (n+) n-type region layered with an n-type doped region. The MOSFET 301 includes a similarly structured second source/drain region 306. A channel region 305 is located in the vertical pillar between the first and the second source/drain regions, 302 and 306 respectively. As shown in the embodiment of FIG. 3A, a gate 309 is separated from the channel region 305 by a gate insulator 307 as is located alongside of the vertical pillar opposing the channel region 305. In the embodiment shown in FIG. 3, the gate insulator 307 includes a gate insulator formed of an oxide-nitride-oxide (ONO) composition 307. In alternative embodiments, discussed below, the gate insulator 307 includes a gate insulator selected from the group of silicon dioxide (SiO$_2$) formed by wet oxidation, silicon oxynitride (SON), silicon rich oxide (SRO), and silicon rich aluminum oxide (Al$_2$O$_3$). In one embodiment, the gate insulator 307 has a thickness of approximately 10 nanometers (nm). In other embodiments, the gate insulator 307 includes a gate insulator 307 selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In still other embodiments, the gate insulator 307 includes a gate insulator 307 which includes a composite layer selected from the group of an oxide-aluminum oxide (Al$_2$O$_3$)-oxide composite layer, and oxide-silicon oxycarbide-oxide composite layer. In still other embodiments, the gate insulator 307 includes a gate insulator 307 which includes a composite layer, or a non-stoichiometric single layer of two or more materials selected from the group of silicon (Si), titanium (Ti), and tantalum (Ta).

Figure 3B:
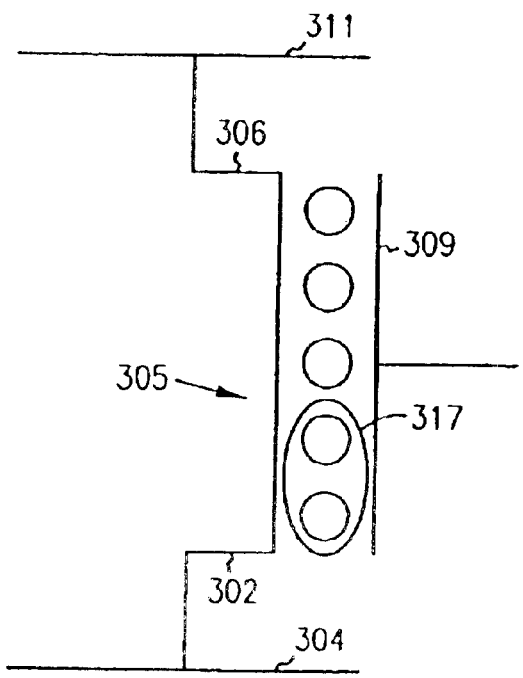
FIG. 3B illustrates an electrical equivalent circuit for the vertical NROM device structure shown in FIG. 3A.

FIG. 3B illustrates an electrical equivalent circuit for the vertical NROM device structure shown in FIG. 3A. As shown in FIG. 3B a first transmission line 304 is coupled to the first source/drain region 302. A second transmission line 311 is coupled to the second source/drain region 306. The circles, shown generally as 317, represent charge traps within the gate insulator 307. Thus, in the embodiment of FIG. 3A where the gate insulator includes an ONO layer, the traps 317 represent locations where electrons can be stored within the nitride of the ONO gate insulator 307.

According to the teachings of the present invention, the vertical MOSFET is a programmed MOSFET having a charge programmed in at least one of a first storage region 340 and a second storage region 350 in the gate insulator 307. In the embodiment shown in FIG. 3A, the first storage region 340 is adjacent, or neighboring, the second source/drain region 306 and the second storage region 350 is adjacent, or neighboring the first source/drain region 302. The designation first or second storage region is provided for spacial relationship reference in the embodiment of FIG. 3A, is not intended to be limiting, and alternatively the first storage region can be associated next to the first source/drain region and the second storage region can be associated next to the second source/drain region.

According to the teachings of the present invention, and as described in more detail below, the vertical MOSFET 301 can be operated in either a first or a second direction, e.g. a first and second mode. That is, the vertical MOSFET 301 can be operated with either the first source/drain region 302 or the second source/drain region 306 serving as the source region. As will be understood by one of ordinary skill in the art upon reading this disclosure, the vertical MOSFET operates at reduced drain source current when reading a programmed charge state stored in either the first or the second storage region, 340 and 350 respectively.

For example, in one embodiment the first source/drain region of the MOSFET serves as a source region and the second source/drain region of the MOSFET serves as a drain region in a first mode of operation, and the first source/drain region of the MOSFET serves as a drain region and the second source/drain region of the MOSFET serves as a source region in a second mode of operation.

As will be understood by one of ordinary skill in the art upon reading this disclosure and according to the teachings of the present invention, in one embodiment the vertical MOSFET has a storage density of one bit per one photolithographic feature squared ($1F^2$) unit area since a bit can be written to, or stored in as well as read from both the first storage region 340 and the second storage region 350. Thus, in some embodiments, the MOSFET includes a charge programmed in both the first storage region 340 and the second storage region 350.

As one of ordinary skill in the art will understand upon reading this disclosure, the charge programmed in the at least one of the first charge storage region 340 and the second storage region 350 creates a high voltage threshold when the MOSFET is operated with the adjacent first source/drain region 302 or the second source/drain region 306 serving as the source region. Thus, in one embodiment of the invention the channel region has a first voltage threshold region (Vt1) adjacent to the first source/drain region a second voltage threshold region (Vt2) adjacent to the second source/drain region which vary depending on in which direction the MOSFET is operated, e.g. which of the first or the second source/drain regions, 302 and 306, is presently serving as the source region.

In one embodiment, the second voltage threshold region (Vt2) in the channel is adjacent the first source/drain region, and the first voltage threshold region (Vt1) in the channel is adjacent the second source/drain region. If a charge stored in the second storage region 350 illustrated in the embodiment of FIG. 3A, then Vt2 has a higher voltage threshold than the Vt1 when the MOSFET is operated with the first source/drain region serving as the source region.

Thus, FIGS. 3A and 3B illustrate a change from previous vertical transistors to now form an NROM type device along the sidewall with, in one embodiment, an ONO gate structure. The nitride layer is used as a first and a second charge storage region when the device is stressed in the reverse direction. The transistor is addressed and read in the forward conduction direction, the presence of stored charge in the first or the second storage region, near the first or the second source/drain region serving as the source, will result in a large change in the current in the forward direction. These transistors as represented by the equivalent circuit, 3B, can be stressed and/or tested in either direction, so that charge can be stored in either end of the channel. This results in the ability of each transistor to store two bits of data and a higher memory density in terms of bits per unit area.

Figure 4A:
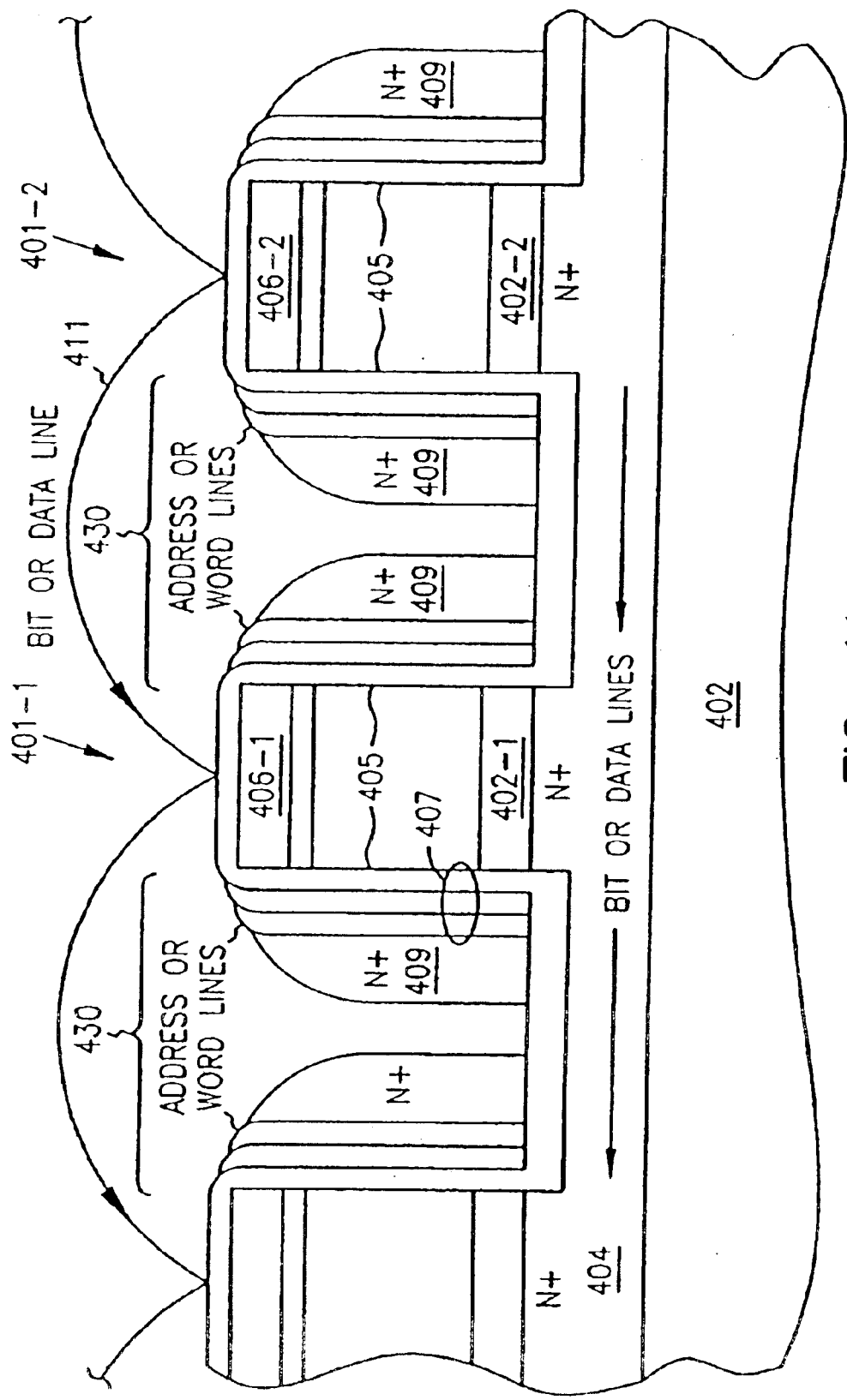
FIG. 4A illustrates a portion of a memory array 400 according to the teachings of the present invention.

FIG. 4A illustrates a portion of a memory array 400 according to the teachings of the present invention. The memory in FIG. 4A, is shown illustrating a number of vertical pillars, vertical multiple bit memory cells, and or vertical MOSFETs 401-1 and 401-2 formed according to the teachings of the present invention. As one of ordinary skill in the art will appreciate upon reading this disclosure, the number of vertical pillar are formed in rows and columns extending outwardly from a substrate 403. As shown in FIG. 4A, the number of vertical pillars, 401-1 and 401-2 are separated by a number of trenches 430. According to the teachings of the present invention, the number of vertical pillars, 401-1 and 401-2, serve as transistors including a first source/drain region, 402-1 and 402-2 respectively. The first source/drain region, 402-1 and 402-2, is coupled to a first transmission line 404. As shown in the embodiment of FIG. 4A, the first transmission line 404 includes a buried first transmission line formed beneath columns of the vertical transistors, 401-1 and 401-2. A second source/drain region, 406-1 and 406-2 respectively, is coupled to a second transmission line 411. Thus, these devices can be formed in array structures such as DRAM arrays, with bit or data lines as a common source line and a common metal wiring line.

As shown in FIG. 4A, a channel region 405 is located between the first and the second source/drain regions. A gate 407 is separated from the channel region 405 by a gate insulator 407 in the trenches 430 along columns of the vertical pillars, 401-1 and 401-2. In one embodiment, according to the teachings of the present invention, the gate insulator 407 includes a gate insulator 407 selected from the group of silicon dioxide ($SiO_2$) formed by wet oxidation, silicon oxynitride (SON), silicon rich oxide (SRO), and aluminum oxide ($Al_2O_3$). In another embodiment, according to the teachings of the present invention, the gate insulator 407 includes a gate insulator 407 selected from the group of silicon rich aluminum oxide insulators, silicon rich oxides with inclusions of nanoparticles of silicon, silicon oxide insulators with inclusions of nanoparticles of silicon carbide, and silicon oxycarbide insulators. In another embodiment, according to the teachings of the present invention, the gate insulator 407 includes a composite layer 407. In this embodiment, the composite layer 407 includes a composite layer 407 selected from the group of an oxide-aluminum oxide ($Al_2O_3$)-oxide composite layer, and oxide-silicon oxycarbide-oxide composite layer. In another embodiment, the composite layer 407 includes a composite layer 407, or a non-stoichiometric single layer, of two or more materials selected from the group of silicon (Si), titanium (Ti), and tantalum (Ta). In another embodiment, according to the teachings of the present invention, the gate insulator 407 includes an oxide-nitride-oxide (ONO) gate insulator 407.

Figure 4B:
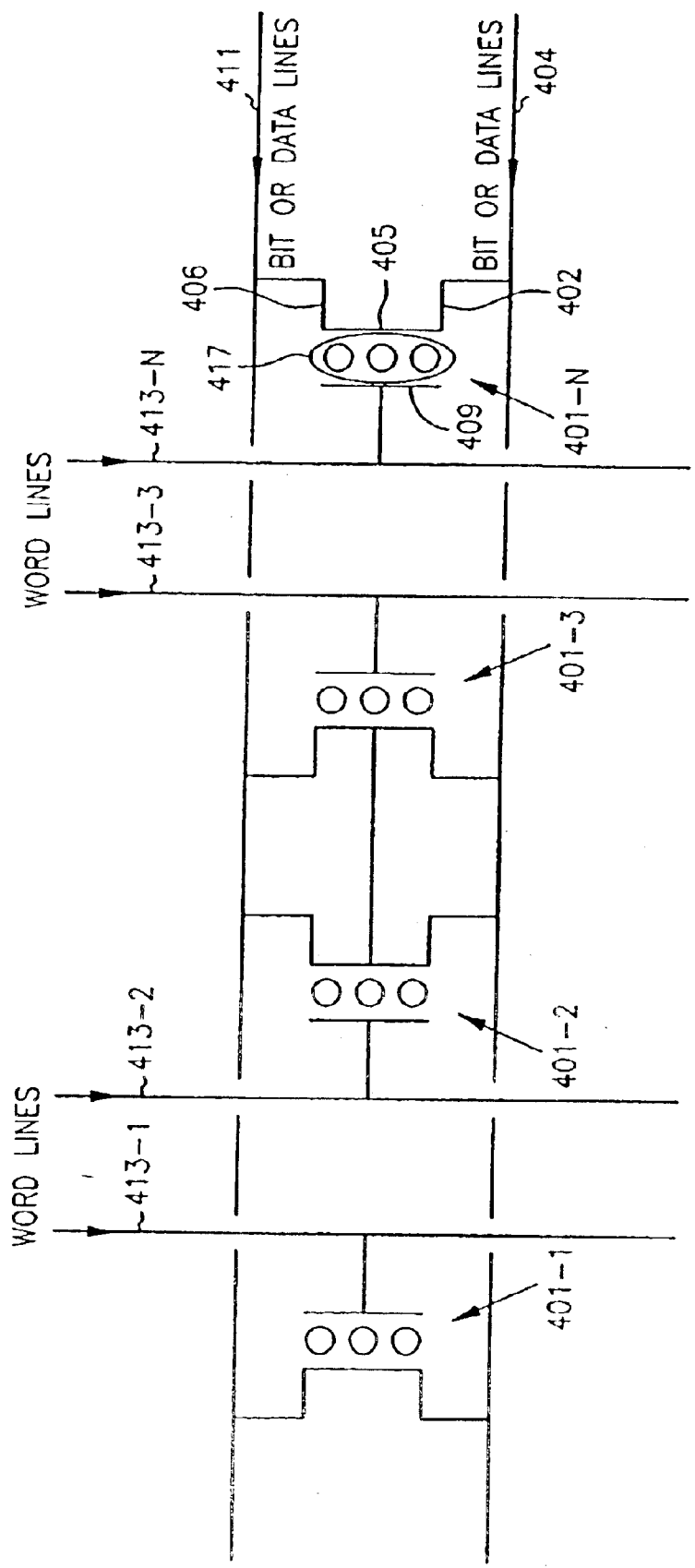
FIG. 4B illustrates an electrical equivalent circuit 400 for the portion of the memory array shown in FIG. 4A.

FIG. 4B illustrates an electrical equivalent circuit 400 for the portion of the memory array shown in FIG. 4A. As shown in FIG. 4B, a number of vertical multiple bit cells, 401-1, 401-2, 401-3, . . . , 401-N, are provided. Each vertical multiple bit cell, 401-1, 401-2, 401-3, . . . , 401-N, includes a first source/drain region, 402, a second source/drain region 406, a channel region 405 between the first and the second source/drain regions, and a gate 409 separated from the channel region by a gate insulator 407. A first and a second storage region, shown generally as 417, exist in the gate insulator 407 as described herein.

FIG. 4B further illustrates a number of first and second transmission lines, bit lines or data lines, 404 and 411, are coupled to the first and the second source/drain regions, 402 and 406 respectively, of each multiple bit cell 401-1, 401-2, 401-3, . . . , 401-N. In one embodiment, as shown in FIG. 4B, the number of first and second transmission lines, bit lines or data lines, 404 and 411, are coupled to the first and the second source/drain regions, 402 and 406 respectively, along columns of the memory array. A number of word lines, such as wordlines 413-1, 413-2, 413-3, . . . , 413-N, in FIG. 4B, are coupled to the gates 409 of each multiple bit cell along rows of the memory array.

The electrical equivalent circuit of FIG. 4B shows the electrical connections in the array. The number of first and second transmission lines, bit lines or data lines, 404 and 411, form a virtual ground in that either one can be grounded depending upon in which direction the transistor is being operated. The transistor is stressed by grounding one line and applying a gate and drain voltage. To read this state the drain and ground are interchanged and the conductivity of the transistor determined. Alternatively, the device can be stressed and read in the opposite direction.

For example, in one embodiment a first write mode, e.g. programming in a first direction, includes creating a hot electron injection into the gate insulator of the one or more vertical MOSFETs and trapping a charge in the first storage region in the gate insulator adjacent to the second source/drain region. In this example, data line 411 will be driven with a high voltage potential, VDD, and the other data line 404 will be held at a ground potential. When a given multiple bit cell 401-1, 401-2, 401-3, . . . , 401-N is addressed using a cell associated wordline, e.g 413-1, 413-2, 413-3, . . . , 413-N, hot electron injection occurs trapping a charge in a first storage region, within 417, in the gate insulator 407 adjacent to the second source/drain region 406. Subsequently, when the multiple bit cell 401-1, 401-2, 401-3, . . . , 401-N is read in the first direction, data line 404 is precharged to a fractional voltage of VDD, data line 411 is grounded, and the cell addressed using a cell associated wordline, e.g 413-1, 413-2, 413-3, . . . , 413-N. The multiple bit cell 401-1, 401-2, 401-3, . . . , 401-N now has a first threshold voltage region (Vt1) adjacent to the first source/drain region 402 and a second threshold voltage region (Vt2) adjacent to the second source/drain region 406, wherein Vt2 is greater than Vt1, and the multiple bit cell 401-1, 401-2, 401-3, . . . , 401-N operates at reduced drain source current reflecting a stored charge trapped in the first storage region, within 417, in the gate insulator 407 adjacent the second source/drain region 406.

Conversely, the multiple bit cell 401-1, 401-2, 401-3, . . . , 401-N is programmed, or written to, and read in a second direction by performing reciprocal actions to those described above. That is, when programming in a second direction, a high voltage potential (VDD) is applied to the first source/drain region 402 of the vertical multiple bit cell, the second source/drain region 406 is grounded, and a gate potential is applied to the gate in order to create a conduction channel between the first and the second source/drain regions of the vertical multiple bit cell. As one or ordinary skill in the art will appreciate upon reading this disclosure, programming in a second direction includes creating a hot electron injection into the gate insulator of the one or more vertical multiple bit cells in a second storage region. This includes trapping a charge in the second storage region in the gate insulator adjacent to the first source/drain region such that when the multiple bit cell is read in the second direction the multiple bit cell has a first threshold voltage region (Vt1) adjacent to the first source/drain region 402 and a second threshold voltage region (Vt2) adjacent to the second source/drain region 406. Here, Vt1 is greater than Vt2 and the MOSFET operates at reduced drain source current when the the first source/drain region 402 is operated as the source region.

In this manner, charge can be stored in either end of the channel 405. As one of ordinary skill in the art will understand according to the teachings of the present invention, there is no interference between the two different storage states since charge stored near the drain has little effect on the transistor's conductivity when it is operated in the saturation region. The devices can be erased by applying a large negative voltage to the gate and positive voltage to the first and/or second source/drain region. The coincidence of gate and first or second source/drain bias at the same location can erase a transistor at this location, but the gate bias alone or first and/or second source/drain region bias alone is not sufficient to disturb or erase the charge storage state of other transistors in the array. This results in the ability of each transistor to store two bits of data and a higher memory density results in terms of bits per unit area.

Hence, when a multiple bit cell 401-1, 401-2, 401-3, . . . , 401-N is addressed its conductivity will be determined by the presence or absence a charge stored in the first or second storage region adjacent to the first or the second source/drain region serving as the source region as measured or compared to a reference or dummy cell and so detected using a sense amplifier. The operation of DRAM sense amplifiers is described, for example, in U.S. Pat. Nos. 5,627,785; 5,280,205; and 5,042,011, all assigned to Micron Technology Inc., and incorporated by reference herein. The array would thus be addressed and read in the conventional manner used in DRAM's, but programmed as multiple bit cells in a novel fashion.

The write and possible erase feature could be used during manufacture and test to initially program all cells or devices to have similar or matching conductivity before use in the field. Likewise, the transistors in the reference or dummy cells can all initially be programmed to have the same conductivity states. According to the teachings of the present invention, a sense amplifier can detect small differences in cell or device characteristics due to stress induced changes in device characteristics during the write operation.

In one embodiment, trapping a charge in the gate insulator adjacent to the second source/drain region includes increasing a normal threshold voltage in the Vt2 by approximately 0.5 Volts when the multiple bit cell is read in the first direction. In one embodiment, reading the one or more MOSFETs in the first and the second directions includes using a sense amplifier to detect a change in an integrated drain current. When read in a first direction, with no charge trapped in the first storage region adjacent the second source/drain region 406, the multiple bit cell will exhibit a change in an integrated drain current of approximately 12.5 $\mu$A when addressed over approximately 10 ns.

In one embodiment, trapping a charge in the gate insulator adjacent to the first source/drain region 402 includes increasing a normal threshold voltage in the Vt1 by approximately 0.5 Volts when the MOSFET is read in the first direction. In one embodiment, reading the one or more MOSFETs in the first and the second directions includes using a sense amplifier to detect a change in an integrated drain current. When read in a second direction, with no charge trapped in the second storage region adjacent the first source/drain region, the multiple bit cell will exhibit a change in an integrated drain current of approximately 12.5 $\mu$A when addressed over approximately 10 ns.

As one of ordinary skill in the art will understand upon reading this disclosure such arrays of multiple bit cells are conveniently realized by a modification of DRAM technology. According to the teachings of the present invention a gate insulator of the multiple bit cell includes gate insulators selected from the group of thicker layers of $SiO_2$ formed by wet oxidation, SON silicon oxynitride, SRO silicon rich oxide, $Al_2O_3$ aluminum oxide, composite layers and implanted oxides with traps (L. Forbes and J. Geusic, "Memory using insulator traps," Micron disclosure 97-0049, U.S. Pat. No. 6,140,181 Oct. 31, 2000). Conventional transistors for address decode and sense amplifiers can be fabricated after this step with normal thin gate insulators of silicon oxide.

Figure 5A:
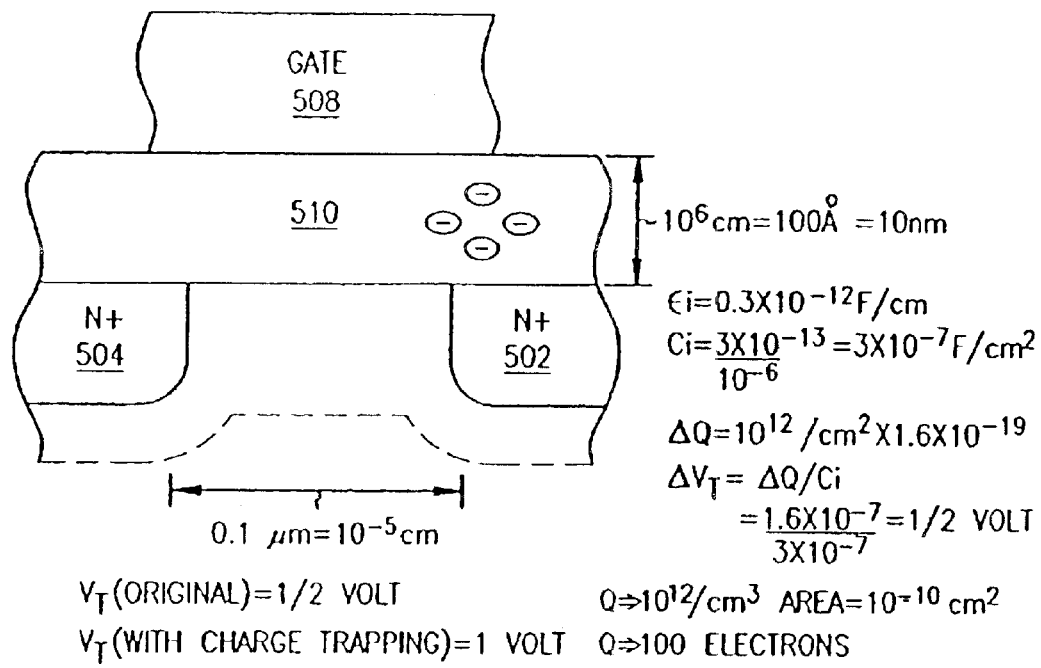
FIGS. 5A–5B illustrates the operation of the novel vertical multiple bit cell formed according to the teachings of the present invention.
Figure 5B:
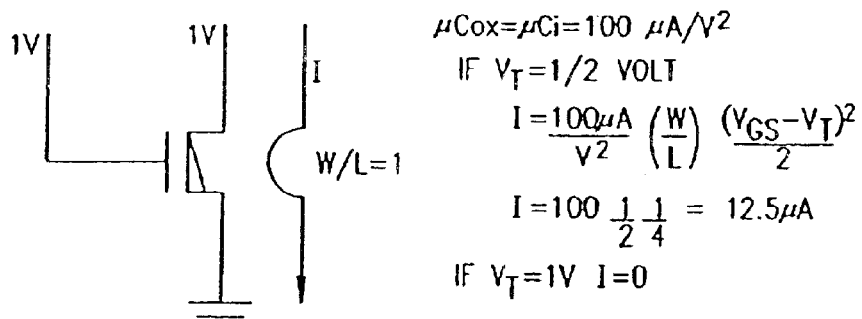
Figure 6:
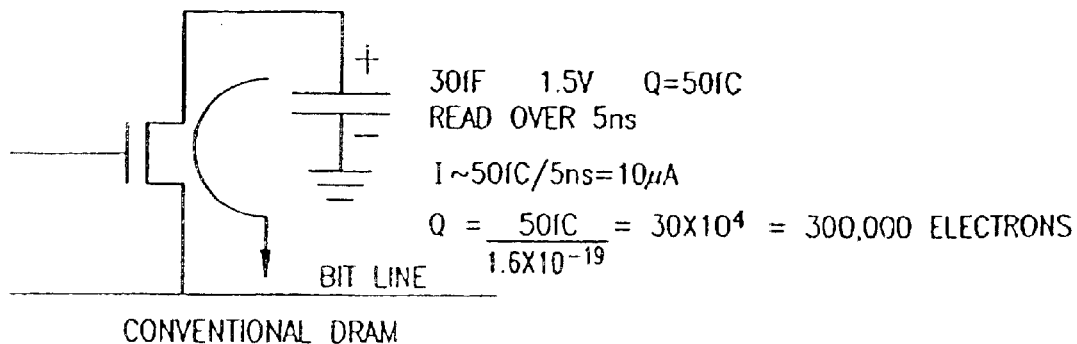
FIG. 6 illustrates the operation of a conventional DRAM cell.

FIGS. 5A–B and 6 are useful in illustrating the use of charge storage in the gate insulator to modulate the conductivity of the vertical multiple bit cell according to the teachings of the present invention. That is, FIGS. 5A–5B illustrates the operation of the novel vertical multiple bit cell 501 formed according to the teachings of the present invention. And, FIG. 6 illustrates the operation of a conventional DRAM cell 601. As shown in FIG. 5A, the gate insulator 502 is made thicker than in a conventional DRAM cell, e.g. 502 is equal to or greater than 10 nm or 100 Å ($10^{-6}$ cm). In the embodiment shown in FIG. 5A a vertical multiple bit cell is illustrated having dimensions of 0.1 $\mu$m ($10^{-5}$ cm) by 0.1 $\mu$m. The capacitance, Ci, of the structure depends on the dielectric constant, $\epsilon_i$, (given here as $0.3 \times 10^{-12}$ F/cm), and the thickness of the insulating layers, t, (given here as $10^{-6}$ cm), such that $Ci = \epsilon i/t$, Farads/cm$^2$ or $3 \times 10^{-7}$ F/cm$^2$. In one embodiment, a charge of $10^{12}$ electrons/cm$^2$ is programmed into the first or the second storage regions in the gate insulator of the vertical multiple bit cell. This produces a stored charge $\Delta Q = 10^{12}$ electrons/cm$^2$ $\times 1.6 \times 10^{-19}$ Coulombs. In this embodiment, the resulting change in the threshold voltage ($\Delta Vt$) of the vertical multiple bit cell will be approximately 0.5 Volts ($\Delta Vt = \Delta Q/Ci$ or $1.6 \times 10^{-7}/3 \times 10^{-7} = \frac{1}{2}$ Volt). In effect, the programmed vertical multiple bit cell, or modified MOSFET is a programmed MOSFET having a charge trapped in the gate insulator adjacent to a first or a second source/drain region, serving as a source region, such that the channel region has a first voltage threshold region (Vt1) and a second voltage threshold region (Vt2), where Vt2 is greater than Vt1, and Vt2 is adjacent the first or the second source/drain region, serving as the source region, such that the programmed MOSFET operates at reduced drain source current. For $\Delta Q = 10^{12}$ electrons/cm$^2$ in the dimensions given above, this embodiment of the present invention involves trapping a charge of approximately 100 electrons in the gate insulator of the vertical multiple bit cell adjacent either the first or the second source/drain region depending on in which direction the multiple bit cell is operated.

FIG. 5B aids to further illustrate the conduction behavior of the novel vertical multiple bit cell of the present invention. As one of ordinary skill in the art will understand upon reading this disclosure, if the vertical multiple bit cell is being driven with a gate voltage of 1.0 Volt (V) and the nominal threshold voltage without the gate insulator charged is $\frac{1}{2}$V, then if the storage region in the gate insulator, adjacent either the first or the second source/drain region serving as the source region, is charged the transistor of the present invention will be off and not conduct. That is, by trapping a charge of approximately 100 electrons in the gate insulator of the vertical multiple bit cell, having dimensions of 0.1 $\mu$m ($10^{-5}$ cm) by 0.1 $\mu$M, will raise the threshold voltage of the vertical multiple bit cell to 1.0 Volt and a 1.0 Volt gate potential will not be sufficient to turn the device on, e.g. Vt=1.0 V, I=0.

Conversely, if the nominal threshold voltage without the gate insulator charged is $\frac{1}{2}$ V, then $I = \mu C_{ox} \times (W/L) \times ((Vgs - Vt)^2/2)$, or 12.5 $\mu$A, with $\mu C_{ox} = \mu C_i = 100 \mu A/V^2$ and W/L=1. That is, the vertical multiple bit cell of the present invention, having the dimensions describe above will produce a current I=100 $\mu A/V^2 \times (\frac{1}{4}) \times (\frac{1}{2}) = 12.5$ $\mu$A when the charge storage region in the gate insulator adjacent either the first or the second source/drain region serving as the source, is not charged. Thus, in the present invention an un-written, or un-programmed storage region the gate insulator adjacent either the first or the second source/drain region serving as the source, can conduct a current of the order 12.5 $\mu$A and a charge stored in the other storage region of the gate insulator, adjacent either the first or the second source/drain region serving as the drain, will not significantly affect the conduction. If the particular storage region in the gate insulator, adjacent either the first or the second source/drain region serving as the source, is charged then the vertical multiple bit cell will not conduct. As one of ordinary skill in the art will understand upon reading this disclosure, the sense amplifiers used in DRAM arrays, and as describe above, can easily detect such differences in current on the bit lines.

By way of comparison, in a conventional DRAM with 30 femtoFarad (fF) storage capacitors charged to 50 femto-Columbs (fC), if these are read over 5 nS then the average current on the bit line is only 10 $\mu$A. This is illustrated in connection with FIG. 6. As shown in FIG. 6, storing a 50 fC charge on the storage capacitor equates to storing 300,000 electrons.

According to the teachings of the present invention, the transistors in the array are utilized not just as passive on or off switches as transfer devices in DRAM arrays but rather as active devices providing gain. In the present invention, to program the transistor "off," requires only a stored charge in the storage region in the gate insulator, adjacent either the first or the second source/drain region serving as the source, of about 100 electrons if the area is 0.1 $\mu$m by 0.1 $\mu$m. Conversely, if the particular storage region of the vertical multiple bit cell is un-programmed, e.g. no stored charge trapped in therein, and if the transistor is addressed over 10 nS, a current of 12.5 $\mu$A is provided. The integrated drain current then has a charge of 125 fC or 800,000 electrons. This is in comparison to the charge on a DRAM capacitor of 50 fC which is only about 300,000 electrons. Hence, the use of the transistors in the array as active devices with gain, rather than just switches, provides an amplification of the stored charge, in the gate insulator, from 100 to 800,000 electrons over a read address period of 10 nS.

The retention of the memory devices depends on mobility degradation, which is for all intensive purposes probably permanent and trapped charge which won't decay with zero or positive gale bias. There are some design considerations involved in that the easier programming with SON and/or SRO insulators will result in shorter retention times.

Figure 7:
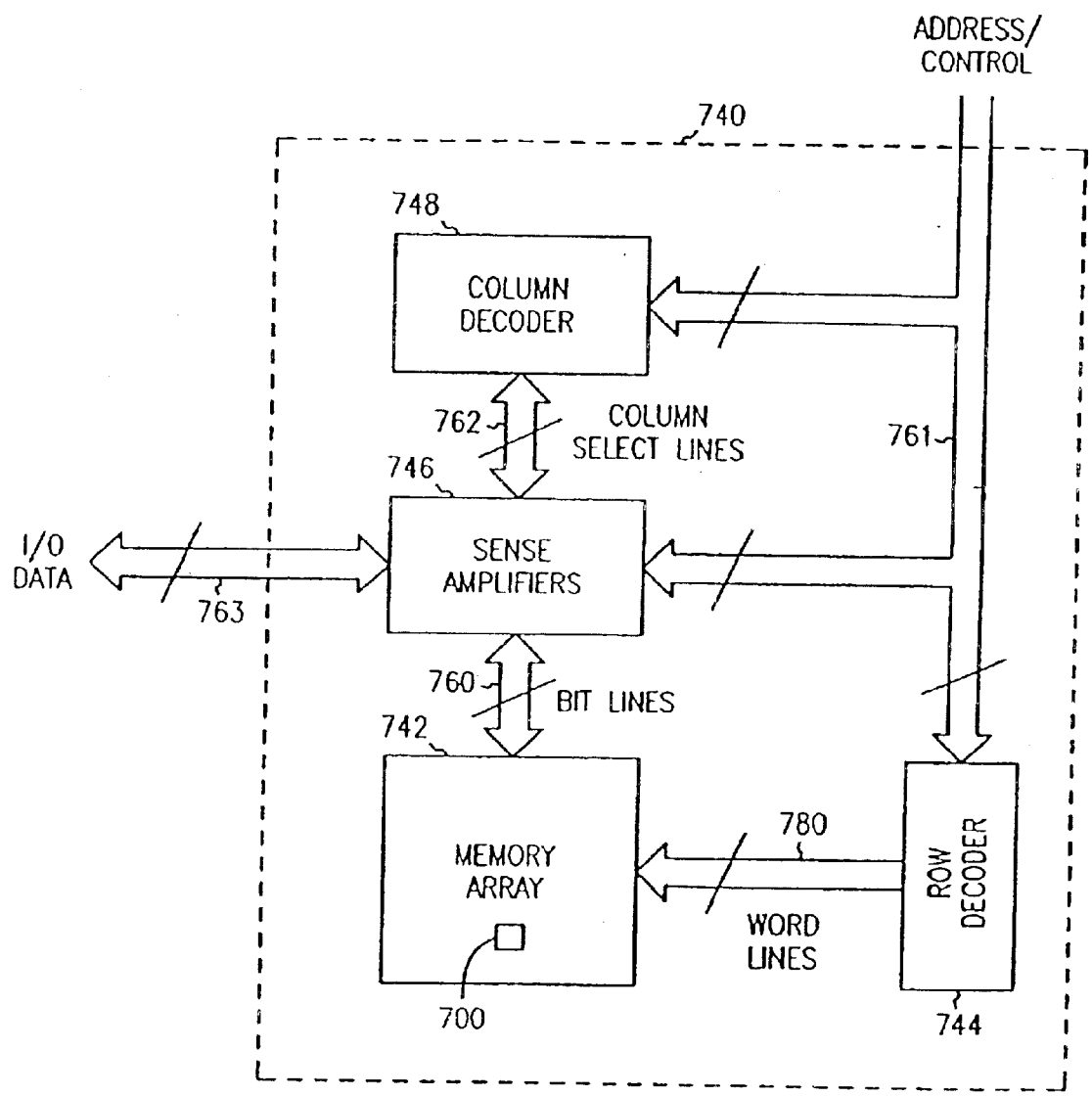
FIG. 7 illustrates a memory device according to the teachings of the present invention.

In FIG. 7 a memory device is illustrated according to the teachings of the present invention. The memory device 740 contains a memory array 742, row and column decoders 744, 748 and a sense amplifier circuit 746. The memory array 742 consists of a plurality of vertical multiple bit cell cells 700, formed according to the teachings of the present invention whose word lines 780 and bit lines 760 are commonly arranged into rows and columns, respectively. The bit lines 760 of the memory array 742 are connected to the sense amplifier circuit 746, while its word lines 780 are connected to the row decoder 744. Address and control signals are input on address/control lines 761 into the memory device 740 and connected to the column decoder 748, sense amplifier circuit 746 and row decoder 744 and are used to gain read and write access, among other things, to the memory array 742.

The column decoder 748 is connected to the sense amplifier circuit 746 via control and column select signals on column select lines 762. The sense amplifier circuit 746 receives input data destined for the memory array 742 and outputs data read from the memory array 742 over input/output (I/O) data lines 763. Data is read from the cells of the memory array 742 by activating a word line 780 (via the row decoder 744), which couples all of the memory cells corresponding to that word line to respective bit lines 760, which define the columns of the array. One or more bit lines 760 are also activated. When a particular word line 780 and bit lines 760 are activated, the sense amplifier circuit 746 connected to a bit line column detects and amplifies the conduction sensed through a given vertical multiple bit cell, where in the read operation the source region of a given cell is couple to a grounded array plate (not shown), and transferred its bit line 760 by measuring the potential difference between the activated bit line 760 and a reference line which may be an inactive bit line. The operation of memory device sense amplifiers is described, for example, in U.S. Pat. Nos. 5,727,785; 5,280,205; and 5,042,011, all assigned to Micron Technology Inc., and incorporated by reference herein.

Figure 8:
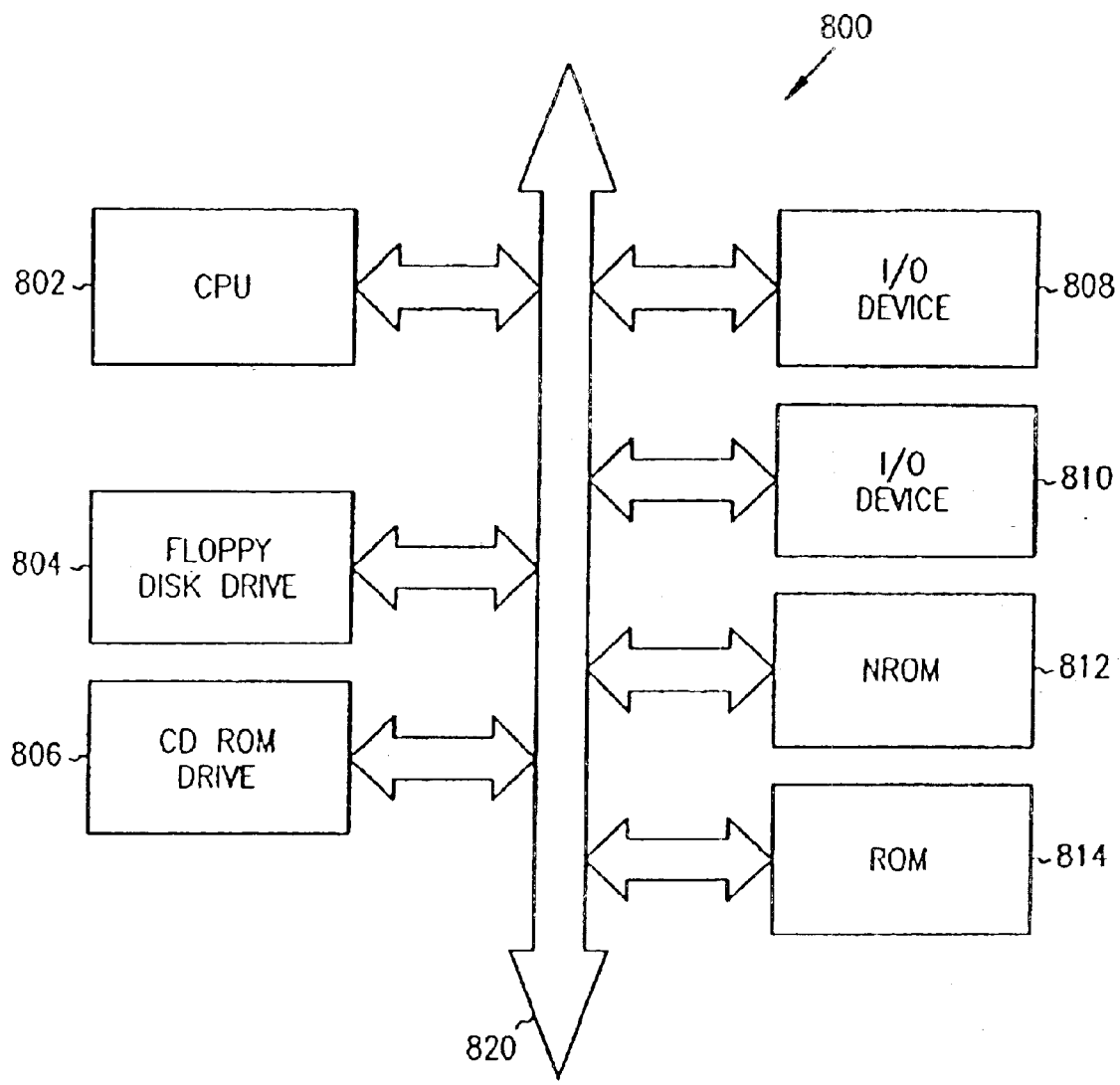
FIG. 8 is a block diagram of an electrical system, or processor-based system, utilizing vertical multiple bit cells constructed in accordance with the present invention.

FIG. 8 is a block diagram of an electrical system, or processor-based system, 800 utilizing vertical multiple bit cell 812 constructed in accordance with the present invention. That is, the vertical multiple bit cell 812 utilizes the modified DRAM cell as explained and described in detail in connection with FIGS. 2–4. The processor-based system 800 may be a computer system, a process control system or any other system employing a processor and associated memory. The system 800 includes a central processing unit (CPU) 802, e.g., a microprocessor, that communicates with the vertical multiple bit cell 812 and an I/O device 808 over a bus 820. It must be noted that the bus 820 may be a series of buses and bridges commonly used in a processor-based system, but for convenience purposes only, the bus 820 has been illustrated as a single bus. A second I/O device 810 is illustrated, but is not necessary to practice the invention. The processor-based system 800 can also includes read-only memory (ROM) 814 and may include peripheral devices such as a floppy disk drive 804 and a compact disk (CD) ROM drive 806 that also communicates with the CPU 802 over the bus 820 as is well known in the art.

It will be appreciated by those skilled in the art that additional circuitry and control signals can be provided, and that the memory device 800 has been simplified to help focus on the invention. At least one of the vertical multiple bit cells in NROM 812 includes a programmed MOSFET having a charge trapped in the charge storage region in the gate insulator, adjacent either the first or the second source/drain region serving as the source, such that the channel region has a first voltage threshold region (Vt1) and a second voltage threshold region (Vt2), where Vt2 is greater than Vt1, and Vt2 is adjacent the source region such that the programmed MOSFET operates at reduced drain source current.

It will be understood that the embodiment shown in FIG. 8 illustrates an embodiment for electronic system circuitry in which the novel memory cells of the present invention are used. The illustration of system 800, as shown in FIG. 8, is intended to provide a general understanding of one application for the structure and circuitry of the present invention, and is not intended to serve as a complete description of all the elements and features of an electronic system using the novel memory cell structures. Further, the invention is equally applicable to any size and type of memory device 800 using the novel memory cells of the present invention and is not intended to be limited to that described above. As one of ordinary skill in the art will understand, such an electronic system can be fabricated in singlepackage processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSION

Utilization of a modification of well established DRAM technology and arrays will serve to afford an inexpensive memory device. Two transistors occupy an area of 4F squared when viewed from above, or each transistor has an area of 2F squared. Since each transistor can store two bits the data storage density is one bit for each 1F squared unit area. "F" is the minimum resolvable photolithographic dimension in the particular CMOS technology. If the particular CMOS technology is 0.1 micron, then the data storage density is 10 Gigabit per square centimeter.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A memory array, comprising:
   a number of vertical pillars formed in rows and columns extending outwardly from a substrate and separated by a number of trenches, wherein the number of vertical pillars serve as transistors including a first source/drain region, a second source/drain region, a channel region between the first and the second source/drain regions, and a gate separated from the channel region by a gate insulator in the trenches along columns of pillars;
   a number of first transmission lines coupled to the first source/drain region of each transistor along columns of the memory array; and
   a number of word lines formed parallel to the trenches along the rows of the memory array and coupled to the gate of each transistor;
   a number of second transmission lines coupled to the second source/drain region of each transistor along columns of the memory array;
   wherein at least one of the multiple bit cell transistors is adapted to have a charge programmed in at least one of a first storage region and a second storage region in the gate insulator and operated with either the first source/drain region or the second source/drain region serving as the source region such that the channel region has a first voltage threshold region (Vt1) adjacent to the first source/drain region a second voltage threshold region (Vt2) adjacent to the second source/drain region which vary depending on in which direction the transistor is operated; and
   wherein the first and second source/drain regions of the transistor share both the first and second source/drain regions respectively from another of the vertical multiple bit cells.

2. The memory array of claim 1, wherein the gate insulator includes a gate insulator selected from the group of silicon rich aluminum oxide insulators, silicon rich oxides with inclusions of nanoparticles of silicon, silicon oxide insulators with inclusions of nanoparticles of silicon carbide, and silicon oxycarbide insulators.

3. The memory array of claim 1, wherein the gate insulator includes a gate insulator selected from the group of silicon dioxide (SiO$_2$) formed by wet oxidation, silicon oxynitride (SON), and silicon rich aluminum oxide.

4. The memory array of claim 1, wherein the gate insulator includes a composite layer.

5. The memory array of claim 4, wherein the composite layer includes a composite layer selected from the group of an oxide-aluminum oxide (Al$_2$O$_3$)-oxide composite layer, and oxide-silicon oxycarbide-oxide composite layer.

6. The memory array of claim 4, wherein the composite layer includes a composite layer, or a non-stoichiometric single layer of two or more materials selected from the group of silicon (Si), titanium (Ti), and tantalum (Ta).

7. The memory array of claim 4, wherein the gate insulator includes one or more layers of oxide-nitride-oxide (ONO).

8. The memory array of claim 1, wherein each trench contains two word lines, where each word line is coupled to the gates of one or more multiple bit cell transistors on one of a first sidewall or a second sidewall of each trench.

9. The memory array of claim 1, wherein one or more of the second transmission lines is a buried bitline.

10. The memory array of claim 1, wherein the transistor includes a charge programmed in both the first storage region and the second storage region.

11. The memory array of claim 1, wherein the first storage region is adjacent the first source/drain region, and wherein the second storage region is adjacent the second source/drain region.

12. The memory array of claim 11, wherein the charge programmed in the at least one of the first charge storage region and the second storage region creates a high voltage threshold when the MOSFET is operated with the adjacent first source/drain region or the second source/drain region serving as the source region.

13. The memory array of claim 1, wherein the gate insulator of each multiple bit cell has a thickness of approximately 10 nanometers (nm).

14. A method for forming a memory array, comprising:
    forming two raised areas on a substrate, defining a trench therebetween;
    forming two vertical multiple bit cells on the sidewalls of the trench, wherein forming the each vertical multiple bit cell includes,
        forming a vertical transistor extending outwardly from a selected sidewall, the transistor having a first source/drain region, a second source/drain region, a channel region between the first and the second source/drain regions, and a gate separated from the channel region by a gate insulator, wherein the first and second source/drain regions of the transistor share the first and second source/drain regions of a second transistor respectively;
        forming a first transmission line coupled to the first source/drain region, and
        forming a second transmission line coupled to the second source/drain region;
    forming at least one word line, where the at least one word line is formed parallel to the trench and is coupled to the gates of one or more multiple bit cell transistors on each sidewall of the trench; and
    wherein forming the transistor includes forming a transistor adapted to have a charge programmed in either a first storage region or a second storage region in the gate insulator and to be operated with either the first source/drain region or the second source/drain region serving as the source region such that the programmed transistor operates at reduced drain source current.

15. The method of claim 14, wherein the raised areas are pillars.

16. The method of claim 14, wherein forming the transistor further comprises forming the transistor with the gate insulator selected from the group of silicon rich aluminum oxide insulators, silicon rich oxides with inclusions of nanoparticles of silicon, silicon oxide insulators with inclusions of nanoparticles of silicon carbide, and silicon oxycarbide insulators.

17. The method of claim 14, wherein forming the transistor further comprises forming the transistor with the gate insulator selected from the group of silicon dioxide (SiO$_2$) formed by wet oxidation, silicon oxynitride (SON), and silicon rich aluminum oxide.

18. The method of claim 14, wherein forming the transistor further comprises forming the transistor with a composite layer gate insulator.

19. The method of claim 18, wherein forming the transistor with a composite layer gate insulator further comprises forming the composite layer gate insulator of one of an oxide-aluminum oxide (Al$_2$O$_3$)-oxide composite layer, and oxide-silicon oxycarbide-oxide composite layer.

20. The method of claim 18, wherein forming the transistor with a composite layer gate insulator further comprises forming the composite layer gate insulator, or a non-stoichiometric single layer, of two or more materials selected from the group of silicon (Si), titanium (Ti), and tantalum (Ta).

21. The method of claim 14, wherein forming the transistor further comprises forming the transistor with a gate insulator that is formed of one or more layers of oxide-nitride-oxide (ONO).

22. The method of claim 14, wherein forming at least one word line, where the at least one word line is formed parallel to the trench and is coupled to the gates of one or more multiple bit cell transistors on each sidewall of the trench further comprises forming two word lines in each tench, where each word line is coupled to the gates of one or more multiple bit cell transistors on one of a first sidewall or a second sidewall of the trench.

23. The method of claim 14, wherein forming a second transmission line coupled to the second source/drain region further comprises forming one or more of the second transmission lines as a buried bitline.

24. A vertical multiple bit cell structure, comprising:
    two raised areas on a substrate, defining a trench therebetween;
    a first vertical multiple bit cell formed on a first sidewall of the trench and a second vertical multiple bit cell formed on a second sidewall of the trench, wherein the first and second vertical multiple bit cell includes,
        a vertical transistor extending outwardly from a selected sidewall, the transistor having, a first source/drain region, a second source/drain region, a channel region between the first and the second source/drain regions, and a gate separated from the channel region by a gate insulator; and
    wherein at least one of the multiple bit cells is adapted to have a charge programmed in at least one of a first storage region and a second storage region in the gate insulator and operated with either the first source/drain region or the second source/drain region serving as the source region such that the channel region has a first voltage threshold region (Vt1) adjacent to the first source/drain region a second voltage threshold region (Vt2) adjacent to the second source/drain region which vary depending on in which direction the transistor is operated.

25. The vertical multiple bit cell structure of claim 24, wherein a first transmission line is coupled to the first source/drain region of each vertical multiple bit cell, and a second transmission line is coupled to the second source/drain region of each vertical multiple bit cell.

26. The vertical multiple bit cell structure of claim 25, wherein the second transmission line is a buried bitline.

27. The vertical multiple bit cell structure of claim 24, wherein one or more word lines are formed parallel to the trenches and coupled to the gate of each vertical multiple bit cell.

28. The vertical multiple bit cell structure of claim 24, wherein the raised areas are pillars.

29. The vertical multiple bit cell structure of claim 24, wherein the gate insulator includes a gate insulator selected from the group of silicon rich aluminum oxide insulators, silicon rich oxides with inclusions of nanoparticles of silicon, silicon oxide insulators with inclusions of nanoparticles of silicon carbide, and silicon oxycarbide insulators.

30. The vertical multiple bit cell structure of claim 24, wherein the gate insulator includes a gate insulator selected from the group of silicon dioxide ($SiO_2$) formed by wet oxidation, silicon oxynitride (SON), and silicon rich aluminum oxide.

31. The vertical multiple bit cell structure of claim 24, wherein the gate insulator includes a composite layer.

32. The vertical multiple bit cell structure of claim 31, wherein the composite layer includes a composite layer selected from the group of an oxide-aluminum oxide ($Al_2O_3$)-oxide composite layer, and oxide-silicon oxycarbide-oxide composite layer.

33. The vertical multiple bit cell structure of claim 31, wherein the composite layer includes a composite layer, or a non-stoichiometric single layer of two or more materials selected from the group of silicon (Si), titanium (Ti), and tantalum (Ta).

34. The vertical multiple bit cell structure of claim 24, wherein the gate insulator includes one or more layers of oxide-nitride-oxide (ONO).

35. The vertical multiple bit cell structure of claim 24, wherein the gate insulator of each multiple bit cell has a thickness of approximately 10 nanometers (nm).

36. An electronic system, comprising:
a processor; and
a memory device coupled to the processor, the memory device having a memory array, the memory array comprising:
a number of vertical transistors extending outwardly from a substrate and separated by trenches, wherein each transistor includes a first source/drain region, a second source/drain region, a channel region between the source and the drain regions, and a gate separated from the channel region by a gate insulator;
a number of first transmission lines coupled to the first source/drain region of each vertical transistor along columns of the memory array;
a number of wordlines formed along rows of the memory array and coupled to the gate of each vertical transistor; and
a number of second transmission lines coupled to the second source/drain region of each vertical transistor along columns of the memory array;
wherein at least one of the transistors is adapted to have a charge programmed in at least one of a first storage region and a second storage region in the gate insulator and operated with either the first source/drain region or the second source/drain region serving as the source region such that the channel region has a first voltage threshold region (Vt1) adjacent to the first source/drain region a second voltage threshold region (Vt2) adjacent to the second source/drain region which vary depending on in which direction the transistor is operated; and
wherein the first and second source/drain regions of the transistor share both the first and second source/drain regions respectively from another of the vertical multiple bit cells.

37. The electronic system of claim 36, wherein, the second voltage threshold region (Vt2) in the channel is adjacent the first source/drain region, and wherein the first voltage threshold region (Vt1) in the channel is adjacent the second source/drain region, and wherein Vt1 has a higher voltage threshold than the Vt2 when the transistor is operated with the second source/drain region serving as the source region.

38. The electronic system of claim 36, wherein one or more of second transmission lines are buried data lines.

39. The electronic system of claim 36, wherein the transistor includes a charge programmed in both the first storage region and the second storage region.

40. The electronic system of claim 36, wherein the first storage region is adjacent the first source/drain region, and wherein the second storage region is adjacent the second source/drain region.

41. The electronic system of claim 40, wherein the charge programmed in the at least one of the first charge storage region and the second storage region creates a high voltage threshold when the transistor is operated with the adjacent first source/drain region or the second source/drain region serving as the source region.

42. A memory device, comprising:
a memory array, the memory array comprising:
a number of vertical transistors extending outwardly from a substrate and separated by trenches, wherein each transistor includes a first source/drain region, a second source/drain region, a channel region between the source and the drain regions, and a gate separated from the channel region by a gate insulator;
a number of first transmission lines coupled to the first source/drain region of each vertical transistor along columns of the memory array;
a number of wordlines formed along rows of the memory array and coupled to the gate of each vertical transistor; and
a number of second transmission lines coupled to the second source/drain region of each vertical transistor along columns of the memory array;
wherein at least one of transistors is adapted to have a charge programmed in at least one of a first storage region and a second storage region in the gate insulator and operated with either the first source/drain region or the second source/drain region serving as the source region such that the channel region has a first voltage threshold region (Vt1) adjacent to the first source/drain region a second voltage threshold region (Vt2) adjacent to the second source/drain region which vary depending on in which direction the transistor is operated; and
wherein the first and second source/drain regions of the transistor share both the first and second source/drain regions respectively from another of the vertical multiple bit cells.

43. The memory device of claim 42, wherein the memory device is a flash memory device.

44. The memory device of claim 42, wherein one or more of second transmission lines are buried data lines.

45. The memory device of claim 42, further comprising:
a wordline address decoder coupled to the number of wordlines;
a first address decoder coupled to the number of first transmission lines;
a second address decoder coupled to the number of second transmission lines; and
a sense amplifier coupled to the first and the second number of transmission lines.

46. The memory device of claim 42, wherein the gate insulator includes a gate insulator selected from the group of silicon rich aluminum oxide insulators, silicon rich oxides with inclusions of nanoparticles of silicon, silicon oxide insulators with inclusions of nanoparticles of silicon carbide, and silicon oxycarbide insulators.

47. The memory device of claim 42, wherein the gate insulator includes a gate insulator selected from the group of silicon dioxide ($SiO_2$) formed by wet oxidation, silicon oxynitride (SON), and silicon rich aluminum oxide.

48. The memory array of claim 42, wherein the gate insulator includes a composite layer.

49. The memory device of claim 48, wherein the composite layer includes a composite layer selected from the group of an oxide-aluminum oxide ($Al_2O_3$)-oxide composite layer, and oxide-silicon oxycarbide-oxide composite layer.

50. The memory device of claim 48, wherein the composite layer includes a composite layer, or a non-stoichiometric single layer of two or more materials selected from the group of silicon (Si), titanium (Ti), and tantalum (Ta).

51. The memory device of claim 48, wherein the gate insulator includes one or more layers of oxide-nitride-oxide (ONO).

52. The memory device of claim 42, wherein each trench contains two word lines, where each word line is coupled to the gates of one or more vertical transistors on one of a first sidewall or a second sidewall of each trench.

53. A method for forming a vertical multiple bit memory cell, comprising:
forming a vertical transistor extending outwardly from a selected sidewall of a raised area of a substrate, the transistor having a first source/drain region, a second source/drain region, a channel region between the first and the second source/drain regions, and a gate separated from the channel region by a gate insulator; and
wherein forming the transistor includes forming a transistor adapted to have a charge programmed in either a first storage region or a second storage region in the gate insulator and to be operated with either the first source/drain region or the second source/drain region serving as the source region such that the programmed transistor operates at reduced drain source current.

54. The method of claim 53, wherein the raised area is a pillar.

55. The method of claim 53, wherein forming the transistor further comprises forming the transistor with the gate insulator selected from the group of silicon rich aluminum oxide insulators, silicon rich oxides with inclusions of nanoparticles of silicon, silicon oxide insulators with inclusions of nanoparticles of silicon carbide, and silicon oxycarbide insulators.

56. The method of claim 53, wherein forming the transistor further comprises forming the transistor with the gate insulator selected from the group of silicon dioxide ($SiO_2$) formed by wet oxidation, silicon oxynitride (SON), and silicon rich aluminum oxide.

57. The method of claim 53, wherein forming the transistor further comprises forming the transistor with a composite layer gate insulator.

58. The method of claim 57, wherein forming the transistor with a composite layer gate insulator further comprises forming the composite layer gate insulator of one of an oxide-aluminum oxide ($Al_2O_3$)-oxide composite layer, and oxide-silicon oxycarbide-oxide composite layer.

59. The method of claim 57, wherein forming the transistor with a composite layer gate insulator further comprises forming the composite layer gate insulator, or a non-stoichiometric single layer, of two or more materials selected from the group of silicon (Si), titanium (Ti), and tantalum (Ta).

60. The method of claim 53, wherein forming the transistor further comprises forming the transistor with a gate insulator that is formed of one or more layers of oxide-nitride-oxide (ONO).

61. The method of claim 53, wherein the first and second source/drain regions of the transistor share the first and second source/drain regions of a second transistor respectively.

* * * * *